(12) United States Patent
Westwick et al.

(10) Patent No.: US 7,873,854 B2
(45) Date of Patent: *Jan. 18, 2011

(54) SYSTEM FOR MONITORING POWER SUPPLY VOLTAGE

(75) Inventors: Alan L. Westwick, Austin, TX (US); Dazhi Wei, Austin, TX (US); Xiaoling Guo, Austin, TX (US); Jia-Hau Liu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 608 days.

This patent is subject to a terminal disclaimer.

(21) Appl. No.: 11/865,654

(22) Filed: Oct. 1, 2007

(65) Prior Publication Data

US 2009/0089605 A1 Apr. 2, 2009

(51) Int. Cl.
*G06F 1/00* (2006.01)
(52) U.S. Cl. ........................... 713/340; 713/300
(58) Field of Classification Search ................. 713/340, 713/300
See application file for complete search history.

(56) References Cited

U.S. PATENT DOCUMENTS

| | | | | |
|---|---|---|---|---|
| 4,586,179 A * | 4/1986 | Sirazi et al. | .................... | 714/22 |
| 5,455,927 A * | 10/1995 | Huang | ......................... | 710/305 |
| 6,035,358 A * | 3/2000 | Tanikawa | ..................... | 710/310 |
| 6,268,764 B1 * | 7/2001 | Eagar et al. | .................. | 327/539 |
| 6,429,705 B1 * | 8/2002 | Bando et al. | ................. | 327/143 |
| 6,472,912 B1 * | 10/2002 | Chiu et al. | ................... | 327/143 |
| 7,411,380 B2 * | 8/2008 | Chang et al. | ................. | 323/314 |
| 2003/0227306 A1 * | 12/2003 | Di Iorio | ...................... | 327/143 |
| 2007/0055900 A1 * | 3/2007 | Choi | .......................... | 713/300 |
| 2009/0085619 A1 * | 4/2009 | Westwick et al. | ........... | 327/143 |

\* cited by examiner

*Primary Examiner*—Chun Cao
(74) *Attorney, Agent, or Firm*—Howison & Arnott, LLP

(57) ABSTRACT

The single chip microcontroller unit includes a processing unit having normal power mode of operation and a low power mode of operation. Analog circuitry and digital circuitry are connected to the processing unit. A power management unit controls power operations of the processing unit, the analog circuitry and the digital circuitry. Power monitoring circuitry provides power control signals to the power management unit. The power monitoring circuitry further includes a system voltage monitoring circuit for generating a system voltage control signal responsive to a system voltage level with respect to a predetermined level. The power monitoring circuitry also includes a supply monitoring circuit for determining if a chip supply voltage level exceeds a threshold level.

24 Claims, 20 Drawing Sheets

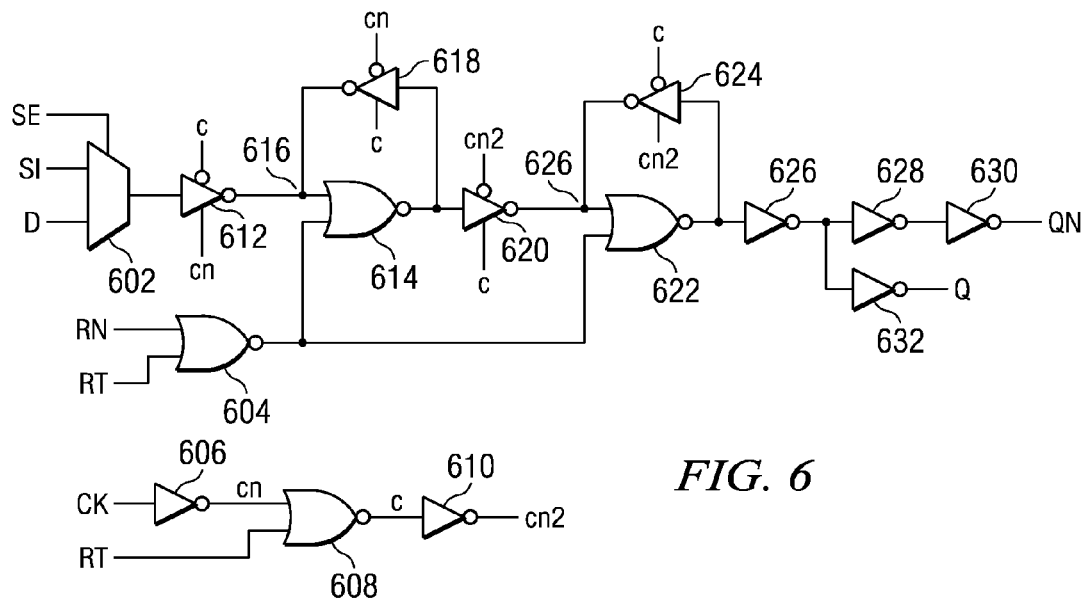
*FIG. 6*
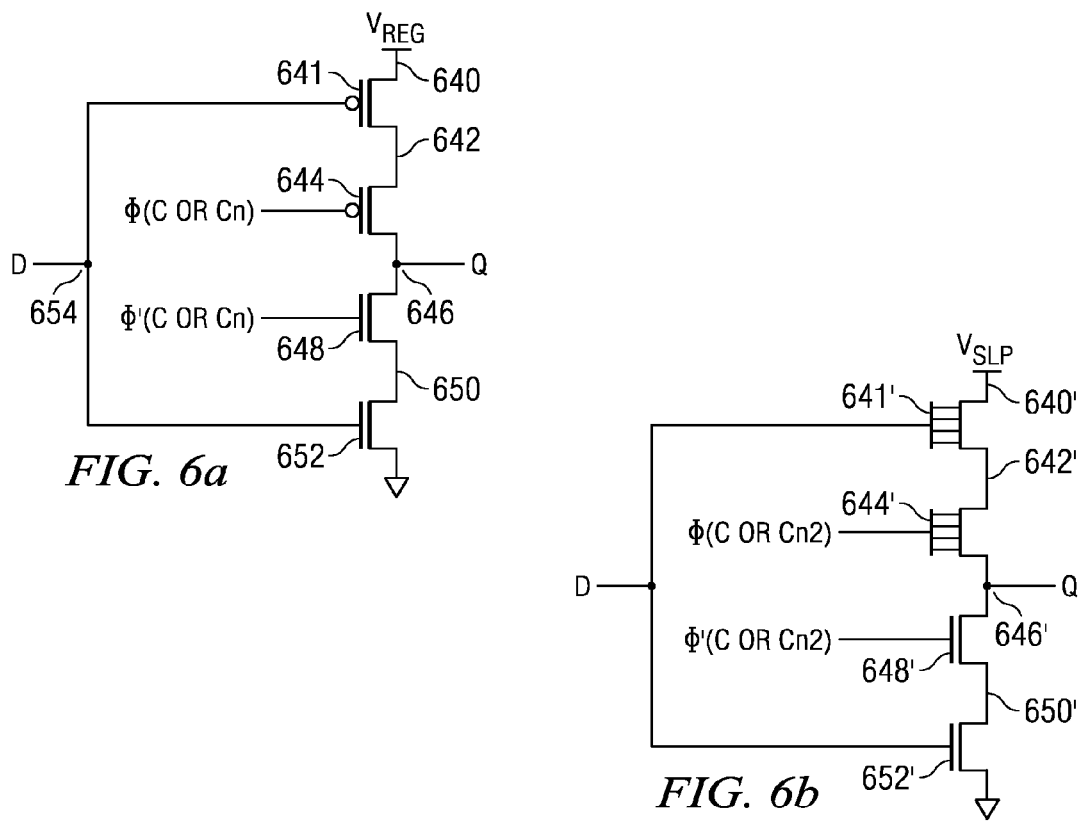
*FIG. 6a*
*FIG. 6b*

| RT | RN | D | SI | SE | CK | Q(n+1) | QN(n+1) | MODE |
|----|----|---|----|----|----|--------|---------|------|
| 0 | 1 | 1 | X | 0 | ↑ | 1 | 0 | NORMAL |
| 0 | 1 | 0 | X | 0 | ↑ | 0 | 1 | NORMAL |
| 0 | 1 | X | X | X | ↓ | Q(n) | QN(n) | HOLD STATE |
| 0 | 1 | X | 1 | 1 | ↑ | 1 | 0 | SCAN |
| 0 | 1 | X | 0 | 1 | ↑ | 0 | 1 | SCAN |
| 0 | 0 | X | X | X | X | 0 | 1 | RESET |
| 1 | X | X | X | X | X | Q(n) | QN(n) | RETENTION |

SYSTEM FOR MONITORING POWER SUPPLY VOLTAGE

TECHNICAL FIELD

The present invention relates to monitoring supply voltages, and more particularly, to controlling operation of a device responsive to monitored supply voltages during startup.

BACKGROUND

Control devices for components such as wireless thermostat controllers or wireless light switches require the use of control circuitry that can operate for long periods of time on a single battery. These types of circuits have long sleep periods wherein minimal power is needed to operate the circuit thus providing a minimal draw on the battery charge. These circuits have very short periods of time when control operations require higher voltage levels in order to accomplish various procedures. In order for these types of circuits to have the necessary operating characteristics, improved circuitries must be provided which will provide optimal power characteristics in both the high power usage and low power usage modes of operation. These types of circuitries also require some type of power control logic enabling ease of switching between these modes of operation having different power usage characteristics.

The power control logic in these types of circuitries require special control during start-up operations. The power control logic cannot begin functioning properly until the system voltage has risen to a desired threshold level. Thus, it is necessary to maintain the power control logic in a reset mode until a desire threshold system voltage can be achieved. However, since the control device is not fully powered up there are some limitations on the types of measurements that can be made across process and temperature variations. Monitoring circuitry for overcoming these issues would be greatly beneficial.

SUMMARY

The present invention, as disclosed and described herein, in one aspect thereof, comprises a single chip microcontroller unit. The single chip microcontroller unit includes a processing unit having normal power mode of operation and a low power mode of operation. Analog circuitry and digital circuitry are connected to the processing unit. A power management unit controls power operations of the processing unit, the analog circuitry and the digital circuitry. Power monitoring circuitry provides power control signals to the power management unit. The power monitoring circuitry further includes a system voltage monitoring circuit for generating a system voltage control signal responsive to a system voltage level with respect to a predetermined level. The power monitoring circuitry also including a supply monitoring circuit for determining if a chip supply voltage level exceeds a threshold level.

BRIEF DESCRIPTION OF THE DRAWINGS

For a more complete understanding, reference is now made to the following description taken in conjunction with the accompanying Drawings in which:

FIG. 6 is a schematic diagram of a retention scan D-flip flop with reset;

FIG. 6a illustrates a clocked inverter with thin oxide transistors;

FIG. 6b illustrates a clocked inverter with thick oxide transistors;

DETAILED DESCRIPTION

Figure 1:
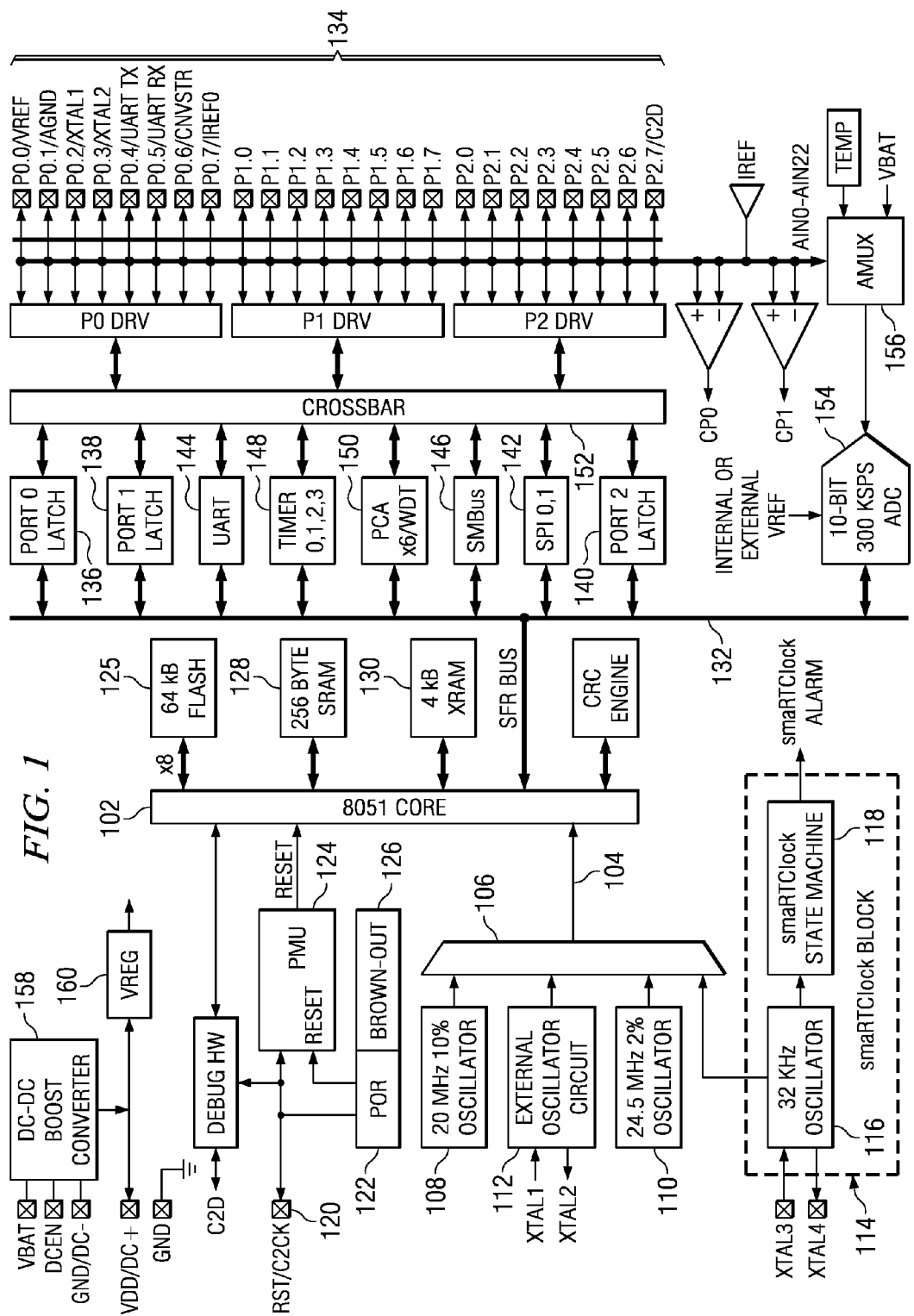
FIG. 1 is a block diagram of a microcontroller unit having various low power modes of operation.

Referring now to the drawings, wherein like reference numbers are used herein to designate like elements throughout, the various views and embodiments of a power supply system for a low power MCU are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated a block diagram of an MCU. The MCU is generally of the type similar to part number CF801F93X/2X manufactured by Silicon Laboratories Inc. The MCU includes in the center thereof a processing core 102 which is typically comprised of a conventional microprocessor of the type "8051." The processing core 102 receives a clock signal on line 104 from a multiplexer 106. The multiplexer 106 is operable to select among multiple clocks. There is provided a 20 MHz internal oscillator 108, a 24.5 MHz trimmable internal precision oscillator 110, an external crystal controlled oscillator 112 and an input from a real time clock (RTC) block 114. The RTC block 114 consists of a 32 kHz oscillator 116 and a state machine 118.

The processing core 102 is operable to receive an external reset on a terminal 120 or is operable to receive the reset signal from a power-on-reset block 122, all of which provide a reset to the processing core 102. The reset is applied through a power management unit 124. A brown-out circuit 126 operates in conjunction with the power on reset 122. The processing core 102 has associated therewith a plurality of resources, those being either flash memory 125, SRAM memory 128 or random access memory 130. The processing core 102 interfaces with various digital circuitry through an onboard digital bus 132 which allows the processing core 102 to interface with various operating pins 134 that can interface external to the chip to receive digital values, to output digital values, to receive analog values or to output analog values. Various digital I/O circuitry are provided, these being latch circuitry 136, 138 and 140, serial port interface circuitry, such as a SPI circuit 142 a UART 144 or an SMBus interface circuit 146. Four timers 148 are provided in addition to a PCA/WDT circuit 150. All of the circuitry 136 though 150 are interfaceable to the output ends 134 through a crossbar device 152, which is operable to configurably interface these devices with select ones of the outputs. Inputs/outputs can also be interfaced to the digital output of an analog-to-digital converter 154 that receives an analog input signal from an analog multiplexer 156 to a plurality of the input pins 134 of the integrated circuit. The analog multiplexer 156 allows for multiple outputs to be sensed through the pins 134 such that the ADC 154 can be interfaced to various sensors. The DC to DC boost converter 158 boosts provided DC voltages to necessary levels on a node 159 (Vdd/DC+) required to operate over the voltage regulation circuit VREG 160 receiving as an input the voltage on node 159. The basic operation of the MCU is disclosed in U.S. Pat. No. 7,171,542, issued Jan. 30, 2007, and assigned to the present Assignee, which patent is incorporated herein in its entirety.

The DC to DC boost converter 158 can receive a direct battery input on a Vbat input or the battery can be directed connected to the input of the regulator 160 on node 159, as will be described in more detail hereinbelow. When operating in an embedded node, an external inductor (not shown) is connected between Vbat and DCEN pin with an external boost capacitor (not shown) connected between the node 159 on pin VDD/DC+ and ground. When the DC to DC converter 158 is disabled, the DCEN pin is connected to ground.

Normal Mode

The MCU is fully functional in Normal Mode. As will be described hereinbelow, there are three supply voltages powering various sections of the chip: VBAT, VDD/DC+, and the 1.8V internal core supply regulated voltage. The regulator 160, the PMU 124 and the RTC 118 are always powered directly from the VBAT pin. All analog peripherals are directly powered from the VDD/DC+ pin, which is an output in 1-cell mode and an input in 2-cell mode. All digital peripherals and the 8051 core 102 are powered from the 1.8V internal core supply output from regulator 160. The RAM is also powered from the core supply in Normal mode.

Idle Mode

To select the Idle Mode, an Idle Mode Select bit in a Power Management Control registered (PCON register) (PCON.0) causes the MCU to halt the CPU and enter Idle mode as soon as the instruction that sets the bit completes execution. All internal registers and memory maintain their original data. All analog and digital peripherals can remain active during Idle mode.

Idle mode is terminated when an enabled interrupt is asserted or a reset occurs. The assertion of an enabled interrupt will cause the Idle Mode Selection bit (PCON.0) to be cleared and the CPU to resume operation. The pending interrupt will be serviced and the next instruction to be executed after the return from interrupt (RETI) will be the instruction immediately following the one that set the Idle Mode Select bit. If Idle mode is terminated by an internal or external reset, the 8051 core 102 performs a normal reset sequence and begins program execution at address 0x0000.

If enabled, the Watchdog Timer (WDT) will eventually cause an internal watchdog reset and thereby terminate the Idle mode. This feature protects the system from an unintended permanent shutdown in the event of an inadvertent write to the PCON register. If this behavior is not desired, the WDT may be disabled by software prior to entering the Idle mode if the WDT was initially configured to allow this operation. This provides the opportunity for additional power savings, allowing the system to remain in the Idle mode indefinitely, waiting for an external stimulus to wake up the system.

Stop Mode

To select the Stop Mode, the Stop Mode Select bit (PCON.1) is set and causes the MCU to enter Stop mode as soon as the instruction that sets the bit completes execution. In Stop mode the precision internal oscillator 110 and CPU 102 are stopped; the state of the low power oscillator 116 and the external oscillator circuit is not affected. Each analog peripheral (including the external oscillator circuit) may be shut down individually prior to entering Stop Mode. Stop mode can only be terminated by an internal or external reset. On reset, the MCU performs the normal reset sequence and begins program execution at address 0x0000.

If enabled, a Missing Clock Detector (MCU) will cause an internal reset and thereby terminate the Stop mode. The Missing Clock Detector should be disabled if the CPU 102 is to be put in Stop mode for longer than the MCD timeout of 100 μsec.

Suspend Mode

To select the Suspend Mode, the Suspend Mode Select bit (PMU0CF.6) is set and causes the system clock to be gated off and all internal oscillators disabled. All digital logic (timers, communication peripherals, interrupts, CPU, etc.) stops functioning until one of the enabled wake-up sources occurs. The following wake-up sources can be configured to wake the device from Suspend Mode:

smaRTClock Oscillator Fail
    smaRTClock Alarm
    Port Match Event
    Comparator0 Rising Edge In addition, a noise glitch on RST that is not long enough to reset the device will cause the device to exit Suspend Mode.

Sleep Mode

Figure 12:
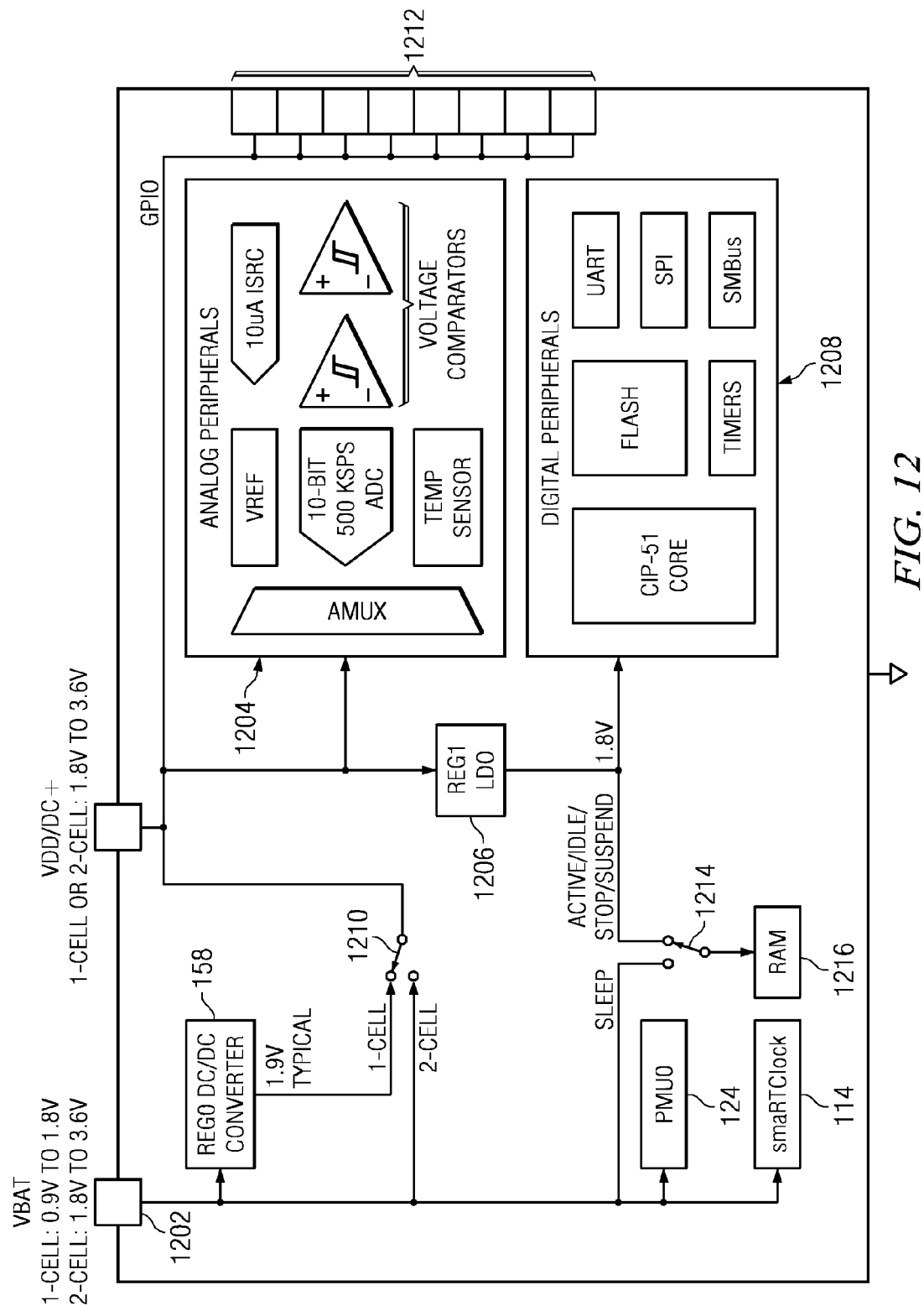
FIG. 12 illustrates the power distribution within the micro controller unit.

To select Sleep Mode, the Sleep Mode Select bit (PMU0CF.6) is set, which turns off the internal 1.8V regulator (REG 1) 160 and switches the power supply of all on-chip RAM to the VBAT pin (see description of FIG. 12 herein). Power to most digital logic on the chip is disconnected; only the PMU and the RTC 118 remain powered. Analog peripherals remain powered in 2-cell mode; however, they lose their supply in 1-cell mode because the DC/DC Converter 158 is disabled. In 2-cell mode, only full analog peripherals (comparators, current reference, etc.) remain functional. The ADC 154 cannot function in Sleep Mode because it relies on digital logic to control it.

RAM contents (data, xdata, and SFRs) are preserved in Sleep Mode as long as the voltage on VBAT does not fall below VPOR. The following wake-up sources can be configured to wake the device from Sleep Mode:

smaRTClock Oscillator Fail
    smaRTClock Alarm
    Port Match Event
    Comparator Rising Edge In addition, a noise glitch on RST that is not long enough to reset the device will cause the device to exit Sleep Mode.

Configuring Wakeup Sources

Before placing the device in a low power mode, one or more wakeup sources should be enabled so that the device does not remain in the low power mode indefinitely. For Idle Mode, this includes enabling any interrupt. For Stop Mode, this includes enabling any reset source or relying on the RST pin to reset the device.

Wake-up sources for Suspend and Sleep Modes are configured through the PMU configuration register. Wake-up sources are enabled by writing '1' to the corresponding wake-up source enable bit. Wake-up sources must be re-enabled each time the device is placed in Suspend or Sleep mode, in the same write that places the device in the low power mode.

Determining the Event that Caused the Last Wakeup

When waking from Idle Mode, the CPU will vector to the interrupt which caused it to wake up. When waking from Stop Mode, the RSTSRC register may be read to determine the cause of the last reset.

Upon exit from Suspend or Sleep Mode, the wake-up flags in the configuration register can be read to determine the event which caused the device to wake up. After waking up, the wake-up flags will continue to be updated if any of the wake-up events occur. Wake-up flags are always updated, even if they are not enabled as wake-up sources.

All wake-up flags enabled as wake-up sources in the configuration editor must be cleared before the device can enter Suspend or Sleep Mode. After clearing the wake-up flags, each of the enabled wake-up events should be checked in the individual peripherals to ensure that a wake-up event did not occur while the wake-up flags were being cleared.

The following are the definition of the PMU configuration and control register:

SFR Definition 12.1. PMU0CF: Power Management Unit Configuration

| | Bit | | | | | | | |
|---|---|---|---|---|---|---|---|---|
| | 7 | 6 | 5 | 4 | 3 | 2 | 1 | 0 |
| Name | SLEEP | SUSPEND | CLEAR | RSTWK | RTCFWK | RTCAWK | PMATWK | CPT0WK |
| Type | W | W | W | R | R/W | R/W | R/W | R/W |
| Reset | 0 | 0 | 0 | Varies | Varies | Varies | Varies | Varies |

SFR Page = 0X0; SFR Address = 0XB5

| Bit | Name | Description | Write | Read |
|---|---|---|---|---|
| 7 | SLEEP | Sleep Mode Select | Writing '1' places the device in Sleep Mode. | N/A |
| 6 | SUSPEND | Suspend Mode Select | Writing '1' places the device in Suspend Mode. | N/A |
| 5 | CLEAR | Wake-up Flag Clear | Writing '1' clears all wake-up flags. | N/A |
| 4 | RSTWK | Reset Pin Wake-up Flag | N/A | Set to '1' if a glitch has been detected on RST. |
| 3 | RTCFWK | smaRTClock Oscillator Fail Wake-up Source Enable and Flag | 0: Disable wake-up on smaRTClock Osc. Fail. 1: Enable wake-up on smaRTClock Osc. Fail. | Set to '1' if the smaRTClock Oscillator has failed. |
| 2 | RTCAWK | smaRTClock Alarm Wake-up Source Enable and Flag | 0: Disable wake-up on smaRTClock Alarm. 1: Enable wake-up on smaRTClock Alarm. | Set to '1' if a smaRTClock Alarm has occurred. |
| 1 | PMATWK | Port Match Wake-up Source Enable and Flag | 0: Disable wake-up on Port Match Event. 1: Enable wake-up on Port Match Event. | Set to '1' if a Port Match Event has occurred. |

-continued

| 0 | CPT0WK | Comparator0 Wake-up Source Enable and Flag | 0: Disable wake-up on Comparator0 rising edge. 1: Enable wake-up on Comparator0 rising edge. | Set to '1' if RST pin caused the last reset. |

Note 1:
Read-modify-write operations (ORL, ANL, etc.) should not be used on this register. Wake-up sources must be re-enabled each time the SLEEP or SUSPEND bits are written to '1'.

SFR Definition 12.2. PCON: Power Management Control Register

| | | | | Bit | | | | |
|---|---|---|---|---|---|---|---|---|
| | 7 | 6 | 5 | 4 | 3 | 2 | 1 | 0 |
| Name | | | GF[5:0] | | | | STOP | IDLE |
| Type | | | R/W | | | | W | W |
| Reset | 0 | 0 | 0 | 0 | 0 | 0 | 0 | 0 |

SFR Page = All Pages; SFR Address = 0X87

| Bit | Name | Description | Write | Read |
|---|---|---|---|---|
| 7-2 | GF[5:0] | General Purpose Flags | Sets the logic value. | Returns the logic value. |
| 1 | PMATWK | Port Match Wake-up Source Enable and Flag | Writing '1' places the device in Stop Mode. | N/A |
| 0 | IDLE | Idle Mode Select | Writing '1' places the device in Idle Mode. | N/A |

The power management unit (PMU) 124 controls the power operations of the MCU and enables the MCU to both power up and power down between sleep (low power) and wake (full power) modes of operation. The PMU 124 also enables the MCU to operate in a number of powered configurations including a single cell configuration and a two cell configuration. In the single cell configuration, the MCU is supplied voltage in the range of 0.9 volts to 1.8 volts. These voltages correspond to the voltage of one alkaline, silver oxide, nickel cadmium or nickel metal hydride cell. The single cell configuration also configures the integrated DC to DC boost converter 158 to generate a 1.8 volt supply voltage to internal circuit blocks.

In the two cell configuration, the MCU is supplied voltage in the range of 1.8 volts to 3.6 volts. These voltages correspond to the voltage of two series alkaline, silver oxide, nickel cadmium or nickel metal hydride cells or one lithium battery cell. In the two cell configuration, the DC to DC converter 158 is disabled and the input and output supply pins are tied to the chip supply. The PMU 124 may also enable provision of a back up battery configuration. The back up battery configuration allows the use of a back up supply (e.g., a coin cell) for the real time clock 114 and sleep mode data retention and provides a separate supply for active mode operation. In the sleep mode configuration, the PMU 124 provides an ultra low current mode of operation. This mode of operation makes use of a differing set of power transistors that enables the retention of provided data while having less leakage currents than are present in a higher power mode of operation. It should be understood that, although only two voltage levels of operation are disclosed, there could be provided many discrete levels of operation, each having an associated voltage range.

Power Management Unit (PMU)

Figure 2:
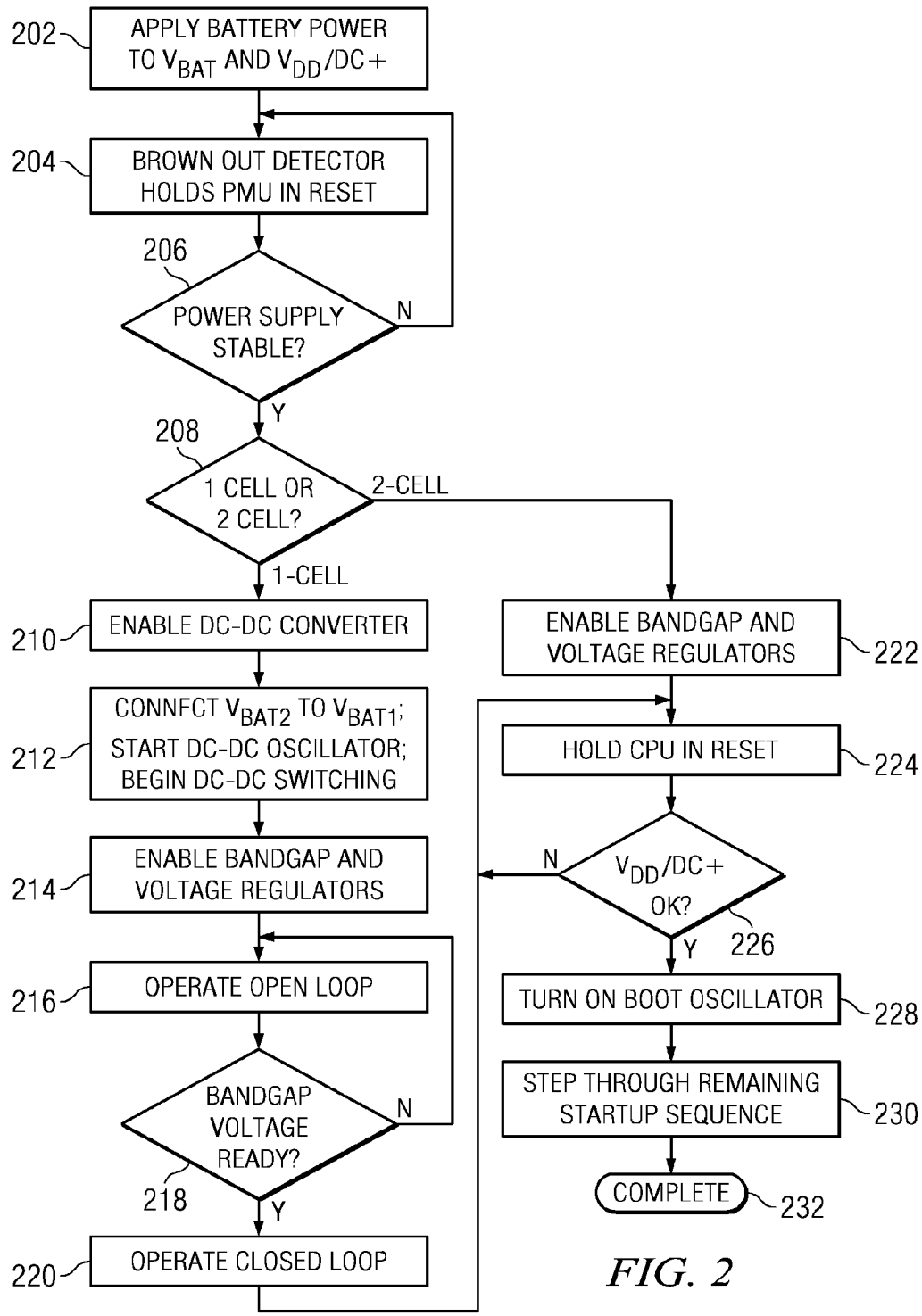
FIG. 2 is a flow diagram illustrating the startup sequence of the MCU of FIG. 1.

During start up of the MCU the PMU 124 controls start up power operations using a start up sequence illustrated in the flow diagram of FIG. 2. This is typically referred to as the Power Up Reset operation. During the start up power sequence, battery power is initially applied at step 202 to the Vbat pin on the input to the DC to DC boost converter in a single cell mode of operation or to the VDD/DC+ pin directly to the voltage register 160 in a two cell mode of operation. The brown-out detector 126 maintains the power management unit (PMU) 124 in a reset mode at step 204. Inquiry step 206 determines if the power supply is stable and outputs a voltage greater than 0.8 volts. If not, the brown-out detector continues to maintain the PMU in reset mode at step 204. If inquiry step 206 determines that the power supply is stable and greater than 0.8 volts, inquiry step 208 determines whether the MCU is operating in a one cell or a two cell mode of operation. This is determined based upon the state of the DCEN pin of the MCU. If the DCEN pin equals Vbat, (the system voltage) the MCU is in the one cell mode. If the SW pin is connected to ground, the MCU is in the two cell mode of operation. If the MCU is in the one cell mode of operation, inquiry step 210 enables the DC to DC boost converter 158 at step 210 to provide a boosted voltage level to the input of the voltage register 160. Next, the node 159 is connected to Vbat at step 212 to quickly charge the external output boost capacitor from ground to voltage Vbat. Additionally, a DC to DC oscillator internal to the boost converter 158 starts up and the DC to DC boost converter 158 begins switching at a defined duty cycle. The PMU 124 enables at step 214 a band gap voltage/current reference block and the voltage regulator 160. The DC to DC boost converter 158 operates in an open loop condition with the defined duty cycle at step 216 and inquiry step 218 determines if the band gap voltage is ready. If not, the DC to DC boost converter continues to operate in the open loop condition. Once inquiry step 218 determines that the band gap voltage is ready, the DC to DC boost converter 158 begins to operate in a closed loop mode of operation to boost the voltage to a register defined level.

If inquiry step 208 determines that the MCU is operating in the two cell configuration, the PMU 124 enables the band gap and voltage regulators at step 222. After the DC to DC boost converter 158 begins operating in the closed loop mode for one cell batteries or after the band gap and voltage regulators have been enabled for two cell batteries, the PMU holds the MCU in reset at step 224. Inquiry step 226 monitors for an indication from the 1.8 volt VDD monitor that the Vbat2_signal is acceptable. This indicates that the band gap reference voltage and current outputs are stable and that the VDD/DC+ voltage (Boost Converter Voltage) being applied is sufficient and that the regulator outputs are stable. Once inquiry step 226 determines that the VDD/DC+ signal is ok the CPU leaves reset mode and a boot oscillator automatically turns on at step 228. This is the reset state of the MCU's clock select block. Next, at inquiry step 230, the PMU 124 uses the output of the boot oscillator to clock a state machine that steps through the remainder of the power start up sequence. This involves the PMU 124 de-asserting the hold signal that maintains the retention flip flops and SRAM in a sleep state. Additionally, the PMU 124 waits for the flash monitor block to verify that the flash memory has powered up and is operational. Finally, the PMU 124 releases the sysclock and CPU reset. The debug service routine (DSR) code begins execution and calibration bits are loaded into the special function registers (SFRs) associated with multiple steps in the operation of the MCU. The start up process is complete at step 232 and customer code execution may commence. At this time, the DC to DC boost converter clock may be connected to SYSCLK.

Figure 3:
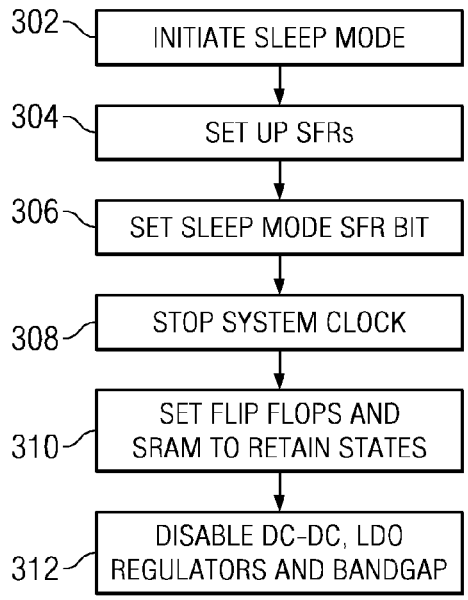
FIG. 3 is a flow diagram illustrating the manner for entering the sleep mode of operation for the MCU of FIG. 1.

The PMU 124 controls transitions into and out of the sleep mode. Referring now to FIG. 3, there is illustrated the process for transitioning into a sleep mode. The sleep mode is initiated by customer software at step 302. Customer software sets up the SFRs (PMU0CF) for desired wake up conditions at step 304. Next, at step 306, the customer software sets the sleep mode SFR bit (PMU0CF.7). The PMU 124 stops the system clock (sysclock) in a low state at step 308. The PMU 124 sets the hold signal to high and connects VSLP to Vbat (this node is used to power RAM) and all of the flip flops and SRAMs are set to retain their present states at step 310. The PMU 124 disables the DC to DC boost converter 158 if it is being used; the LDO regulators and band gap generator are also disabled. This causes the internal regulated supply to collapse to 0 at step 312.

Figure 4:
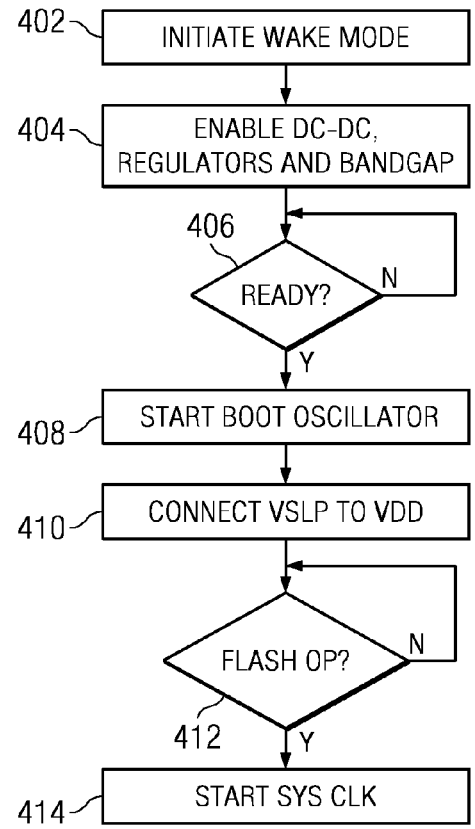
FIG. 4 is a flow diagram illustrating the operation of the wakeup mode of operation for the MCU of FIG. 1.

Referring now to FIG. 4, there is illustrated the manner in which the PMU 124 assists the MCU in transitioning out of sleep mode. The wake mode is initiated at step 402. The wake mode may be initiated by 1) a change in digital state or voltage level on one of the I/O pins, and 2) the device can be programmed to wake up after a predetermined time that is programmed into the real-time clock 118. The PMU 124 enables the DC to DC boost converter 158, the band gap reference generator and the regulators at step 404. Inquiry step 406 enables the VDD monitor to determine when the VDD/DC+ voltage, the band gap generator and the voltage regulators are ready to operate. Once these are each ready, the boot oscillator is started at step 408. The PMU 124 connects the VSLP node to the VDD/DC+ pin and sets the HOLD pin low at step 410. At inquiry step 412, the PMU 124 waits for the flash monitor to indicate that the flash memory is operational. Once the flash memory is operational, the system clock is started at step 410 which enables the resumption of instruction execution of a customer program at the point at which it left off upon entering Sleep Mode.

Retention Flip-Flops

Figure 5:
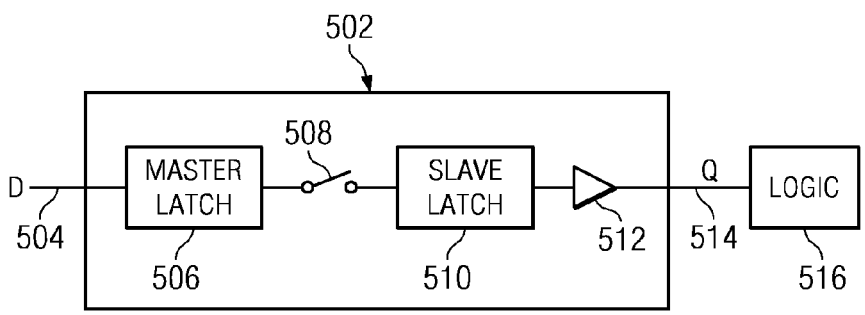
FIG. 5 is a block diagram of a retention flip-flop.

As described previously, when the PMU 124 is transitioning the MCU into a sleep mode of operation, the digital circuits within the MCU all retain their state such that, when the MCU is awakened, the digital components may return to their existing state at the time of entering sleep mode. It is noted that, during the Sleep Mode of operation, the power to the digital peripherals including the CPU 102, Flash 125, etc., has been removed. The states of the digital components are maintained in retention flip flops within the MCU as illustrated in FIG. 5.

At select inputs and select outputs of a certain portion of the logic circuitry, it is important that the states of those inputs and outputs are retained on power up of the digital circuitry. As such, master/slave latches are employed that will latch the states and remain in a powered up state when the power is restored to the digital circuitry. Thus, during execution of instructions, at the point in time that the sleep mode of operation is entered, these select locations within the logic circuitry will have the state thereof maintained. However, as will be described hereinbelow, these retention flip flops are 2× slower during normal active operation. This does not overly impact the execution speed of the digital circuitry, as the number of digital inputs/outputs that have their states protected are small compared to the total number of gates. Thus, the execution speed is minimally impacted. The circuitry of FIG. 5 illustrates a retention flip flop on an input to logic circuitry 516, but this could be used on any output and on any logic node in the digital circuitry.

The retention flip-flops 502 include a D-input 504 which applies a digital input signal to master latch circuitry 506. The master latch circuitry 506 is connected to a switching circuit 508 for disconnecting or isolating the master latch circuit 506 from the slave latch circuit 510 when the retention flip-flop 502 enters the sleep mode of operation. The output of the retention flip-flop is driven by a driver 512 to a Q-output 514. The output 514 is connected to additional digital logic circuitry 516 within the MCU. The transistors implemented within the MCU circuit of FIG. 1 utilize 0.18 micron technology. Lower resolution technologies do not enable the MCU circuitry to perform operations at 1.8 volts. However, 0.18 micron technology, while enabling operation at 1.8 volts inherently has current leakage problems associated therewith when the MCU circuitry enters the sleep mode of operation when a voltage of 1.8 volts is utilized as the $V_{DD}$. In order to overcome the current leakage problems when the MCU is in sleep mode, a combination of both core transistors and I/O transistors are used within the retention flip flops.

The core transistors are 0.18 micron thin oxide transistors that are used for operating the digital circuits when the MCU is in the active (powered) mode. These transistors provide sufficiently fast operation for substantially all of the processing operations performed by the MCU when in the active mode. However, these thin oxide transistors have very high leakage currents when MCU is in Sleep Mode and non-operational, i.e., even though the transistor is "off", excessive leakage current combines to flow from $V_{DD}$ to $V_{SS}$. There, these transistors will be powered off during Sleep Mode. In order to avoid this problem, the digital circuits also make use of the I/O transistors, which are thick oxide transistors, in select locations. These thick oxide transistors are low leakage transistors but are large and slow at low voltages, but there are relatively few of these and they can remain powered on during sleep mode.

The retention flip flops 502 are used to switch between the use of the I/O transistors in the sleep mode and the core transistors in the active (powered) mode. The I/O transistors which are used in the sleep mode are implemented within the slave latch 510. The slave latch 510 is responsible for storing the state of the value on the output 514 of the retention flip-flop when the MCU enters the sleep mode and allowing the I/O transistors associated therewith to be connected to an isolated power supply. During the sleep mode of operation when the retention flip-flop 502 is maintaining the last value on the output 514, the switch 508 will be in an open state.

When the MCU is in the active state, the switch 508 of the retention flip-flop 502 is closed enabling the input applied to D-input 504 to be applied to the master latch 506. The master latch 506 and the output driver 512 are configured using thin oxide core transistors that have better operating characteristics in the active mode of operation, i.e., they are faster. Since the switch 508 is closed in the active mode, the retention flip-flop may pass values from the input to the output during the active mode to the connected logic circuitry 516 albeit this small portion of the logic circuitry will be approximately 2× slower. The I/O transistors may also be used in other circuitries of the MCU to assist in low powered and active modes of operation.

Referring now to FIG. 6, there is illustrated a functional schematic diagram of the retention scan D flip flops with reset such as that illustrated in FIG. 5. The retention flip flops work like a normal flip-flop in the active operation mode. The flip-flop stores its current state when it is powered down. The use of the I/O and core transistors enables minimization of leakage currents when the chip powers down into a sleep mode. The 3.3 volt I/O transistors have a higher voltage threshold and thus a lower leakage current than the 1.8 volt core transistors.

As shown in FIG. 6, a multiplexer 602 is connected to receive the input data signal D and the signal SI (Scan Input). Control signal SE (Scan Enable) provides control information to the multiplexer 602 enabling selection between the SI and D signals. Retention signal RT and Reset Not signal RN (a low asserted reset signal) are applied to the inputs of a NOR gate 604. The clock signal CK is applied to the input of an inverter 606, and the output of the inverter 606 is applied to another input of NOR gate 608. The retention signal RT is applied to the second input of NOR gate 608. The output of NOR gate 608 comprises control input C which is applied to various inverter circuits throughout the retention scan D flip-flop with reset. The control signal C is applied through an inverter 610 to generate a second control signal CN2 which is also applied to several inverter circuits. The output of the multiplexer 602 is applied to an input of an inverter 612. The inverter 612 is also connected to receive control signals at an inverted input of control signal C and at a non inverted input of control signal CN. CN is a low-voltage signal for driving thin-oxide transistors, while CN2 is a high-voltage signal for driving thick oxide I/O transistors. The output of inverter 612 is applied to one input of NOR gate 614 and the second input of NOR gate 614 is connected to the output of NOR gate 604. A feedback inverter is applied from the output of NOR gate 614 to the input of NOR gate 614 at node 616. The inverter feedback loop consists of an inverter 618. The inverter 618 has an inverted input to receive the control signal CN and a non inverted input to receive the control signal C.

The output of NOR gate 614 is also connected to the input of an inverter 620. The inverter 620 receives the control signal CN2 on an inverted input and the control signal C on a non-inverted input. The output of inverter 620 is connected to the input of NOR gate 622. The other input of NOR gate 622 is connected to the output of NOR gate 604. An inverter 624 is connected between the output of NOR gate 622 and the input of NOR gate 622 at node 626. The inverter 624 also has the control signal C connected to an inverted input and the control signal CN2 connected to a non inverted input. The output of NOR gate 622 is connected to the input of an inverter chain consisting of inverters 626, 628 and 630 which are connected in series. The output of inverter 630 provides the $\overline{Q}$ output. An inverter 632 is connected to the node between the output of inverter 626 and the input of inverter 628 to the input of inverter 632. The output of inverter 632 provides the output signal Q.

The slave latch gates 610, 622, and 624 are powered from the Vslp supply, which maintains its voltage level during sleep mode. All of these gates are built using low-leakage I/O transistors. Vslp can range from 0.9V to 3.6V during sleep mode, so those devices must be I/O devices not only for low leakage, but also so that they are not damaged by the high voltages (above 1.8V) that the gates see during sleep mode. All other gates are powered by the internal regulated voltage supply, which shuts off in sleep mode. Most of those devices are built using low-voltage core transistors, which are smaller and faster than the I/O transistors. However, gates 620, 626, and 608 also use I/O transistors, because they may be exposed to high voltages on their inputs or outputs due to their interfacing with the gates in the slave latch. The Vslp and internal regulated supply voltages are tied together during normal operating mode by an I/O pmos transistor. This transistor has its gate connected to RT, its drain connected to the internal regulated supply, and its source connected to Vslp. Since it is a pmos device, it is conductive when RT is low in voltage (during normal mode) and is nonconductive when RT is high (in sleep mode).

In operation, the inverters 612, 618, 620 and 624 are clocked inverters. In essence, a clocked inverter is an inverter that is either in state where the data on the input results in a corresponding digital value on the output thereof or it operates in a state where it "floats". The two types of clock inverters are one fabricated with thick oxide transistors or thin oxide transistors. The thin oxide transistor clocked inverter is illustrated in FIG. 6a. This is a relatively straight forward clock inverter and more complex structures or circuitry could be utilized. The clocked inverter is disposed between the regulated voltage, i.e., the 1.8 volt voltage that is provided to all of the digital circuitry during active mode. This is comprised of two P-Channel transistors and two N-Channel transistors. The first P-channel transistor 641 has the source/drain path thereof connected between a $V_{REG}$ node 640 and a node 642. The node 642 is connected to one side of the source/drain path of the other of the P-channel transistor 644, P-channel transistor 644, on the other side of the source/drain path thereof connected to an output node 646. The two N-channel transistors are connected in series between nodes 646 and ground. A first N-channel transistor 648 has the source/drain path thereof connected between node 646 and a node 650, node 650 connected to one side of the source/drain path thereof of the other N-channel transistor, N-channel 652, and ground. The gates of transistors 652 and 641 are connected together and to an input node 654. The gate of P-channel transistor 644 is connected to a first clock signal Φ and the gate of the N-channel transistor 648 is connected to a clock Φ'. Thus, whenever the gate of transistor 644 is low, turning on transistor 644, and the gate of transistor 648 is high, turning on transistor 648, then the inverter is in an active mode. When the opposite condition is true, i.e., the gate of transistor 644 is high and the gate of transistor 648 is low, the output of the inverter is "tri-stated". Thus, in that state, the output would float or it would be indeterminate; that is, the value of the data node 654 would not affect the signal on node 646.

With reference to FIG. 6b, there is illustrated the same diagram with respect to a clock inverter with thick oxide transistors. The only thick oxide transistors that are necessary are the P-channel transistors 641' and 644', as the N-channel transistors 648' and 652' can be fabricated with thin oxide transistors. The thick oxide transistors are off, such that current will no be conducted therethrough, the leakage current through the thick oxide transistors is minimal, thus preventing any current being conducted through the N-channel thin oxide transistors. Thus, only the P-channel transistors, fabricated with PMOS technology, need be fabricated with thick oxide transistors. However, it is noted that, in order to fabricate such transistors, a separate N-well must be utilized for these transistors. Therefore, if a "1" is being latched on the output, there will no leakage from the power supply; rather, the only leakage would be from the node on which the data stored and this will be minimal through the thin oxide transistors 648' and 652', noting that there will be no power consumed from the power supply. However, in the event that the output is floated, the transistors 641' and 644' will be turned off and the transistors 648' and 652' will be turned off but the state of the node 646' must be retained and therefore, the voltage $V_{SLP}$, the voltage for the sleep mode, must be maintained in a powered up condition. In this mode, all of the transistors are off and it is desired to minimize the amount of current leaking between the two power supplies.

In operation, it can be seen that the latch 620 is powered with the structure of FIG. 6b. In FIG. 6b, this clocked inverter will be placed in the floating state whenever the signal RT is high, resulting in a low on the output NOR gate 608 and high on the output of the inverter 610. Since the clock signal cn2 is connected to the gate of the P-channel transistor, this will turn the P-channel transistor 644' off and the clock signal c, which is at a logic low, will be connected to the gate of the transistor 648'. Thus, the transistor 644' and 648' will be turned off. The value of the data on the input node thereto will not effect the output, but the value on the output will be at a known state, i.e., it is known that the transistor 644' and the transistor 648' is turned off. The logic state on the node 626 will be inverted by the NOR gate 622, which is fabricated with thick oxide transistors in the P-channel side thereof. This will cause a logic "1" for example, to be reflected and a logic "0" on the other side thereof. The inverter 624, which is fabricated with the structure of FIG. 6b, will have the P-channel transistor 644' turned on, since the signal c is a logic low and the N-channel transistor 648' will be turned on since the signal cn2 is connected to the gate thereof and is high. This will therefore transfer the logic "0" and latch the value thereon. This is the slave latch. Additionally, the NOR gate 604 can be fabricated with high-voltage PMOS transistors. However, it is noted that when RT is high, the output will be low and if the voltage is removed and the NOR gate were fabricated with thin oxide transistors, the output would be at a logic low anyway. However, it is important that the NOR gate 622 have thick oxide P-channel transistors associated therewith in order to allow the output to be a "1" when the input on node 626 is a low. Thus, only the clocked inverters 620 and 624 and the NOR gate 622 are required to have thick oxide P-channel transistors and the voltages thereof connected to $V_{SLP}$. The voltages associated with drivers 626, 628, and 630, in addition to driver 632 use thin oxide transistors and can be connected to the voltage to $V_{REG}$. This is also associated with the master portion of the latch, which is associated with the clocked inverter 618, which is configured with the structure of FIG. 6a.

The clock circuit, when RT is at a logic "1", this results in the output of NOR gate 608 being at a logic low, thus, there are no thick oxide PMOS transistors that are required in this circuit. However, the inverter 610 requires PMOS transistors fabricated with thick oxides such that the output thereof can be pulled high when RT is a logic "1". Thus, the inverter 610 is also connected to the $V_{SLP}$. This results in the inverter 610, the clocked inverter 620, the clocked inverter 624 and NOR gate 622 being connected to $V_{SLP}$ at the minimum in order to retain the value stored therein when the latch mode is asserted in the presence of RT being in a logic high.

Figures 7, 8:
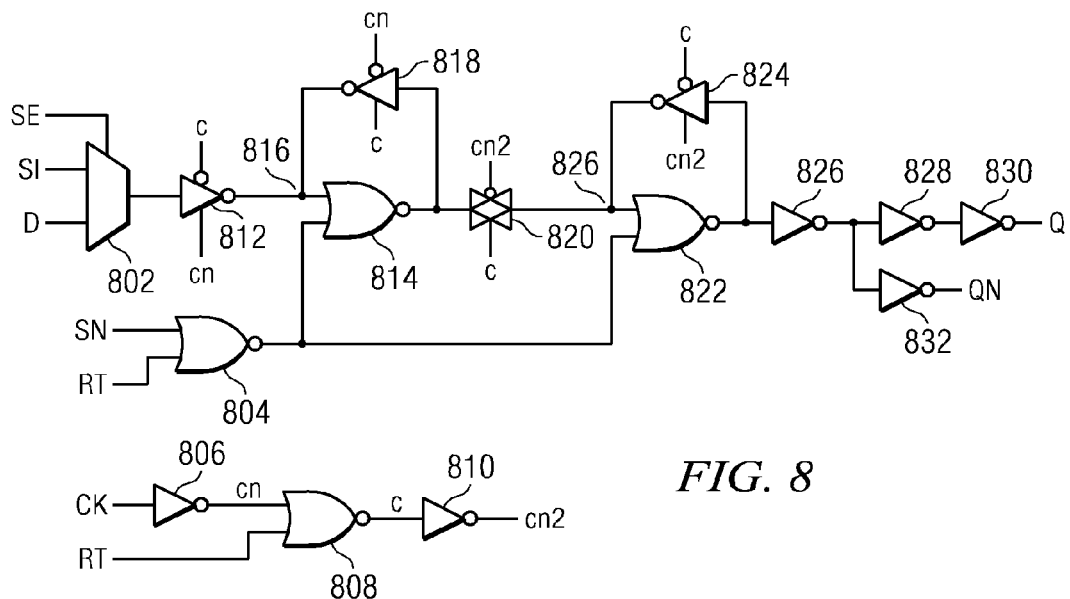
FIG. 7 is a table illustrating the operation of the flip flop of FIG. 6 responsive to various input values.
FIG. 8 is a schematic diagram of a retention scan D-flip flop with set.

With reference to FIG. 7, the operation has been somewhat simplified.

Referring now to FIG. 8, there is illustrated a second embodiment of the retention flip-flops wherein a retention scan D flip-flop with set is utilized. The retention flip flops with set work like a normal flip-flop in the normal operation mode. The flip-flop stores its current global change state when it is powered down. The use of the I/O and core transistors enables minimization of leakage currents when the chip powers down into a sleep mode. The 3.3 volt I/O transistors have a higher voltage threshold and thus a lower leakage current than 1.8 volt core transistors. A multiplexer 802 is connected to receive the input data signal D and the signal SI (Scan Input) control signal SE (Scan Enable) provides control information to the multiplexer 802 enabling selection between the SI and D signals. Retention signal RT and set signal SN are applied to the inputs of a NOR gate 804. The clock signal CK is applied to the input of an inverter 806 and the output of the inverter 806 is applied to another input of NOR gate 808. The retention signal RT is applied to the second input of NOR gate 808. The output of NOR gate 808 comprises control input C which is applied to various inverter circuits throughout the retention scan D flip-flop with set. The control signal C is applied through an inverter 810 to generate a second control signal CN2 which is also applied to several inverter circuits.

The output of the multiplexer 802 is applied to a input of an inverter 612. The inverter 812 is also connected to receive control signals in an inverted input of control signal C and a non inverted input of control signal CN2. The output of inverter 612 is applied to one input of NAND gate 814, and the second input of NAND gate 814 is connected to the set signal SN. A feedback inverter is applied from the output of NAND gate 814 to the input of NAND gate 814 at node 818.

The inverter feedback loop consists of an inverter 818. The inverter 818 has an inverted input to receive the control signal CN2 and a non inverted input to receive the control signal C. The output of NAND gate 814 is also connected to the input of an inverter 820. The inverter 820 receives the control signal CN2 on an inverted input and the control signal C on a non inverted input. The output of inverter 820 is connected to the input of NOR gate 822. The other input of NOR gate 822 is connected to the output of NOR gate 804. An inverter 824 is connected between the output of NOR gate 822 and the input of NOR gate 822 at node 826. The inverter 824 also has the control signal C connected to an inverted input and the control signal CN2 connected to a non inverted input. The output of NOR gate 822 is connected to the input of an inverter chain consisting of inverters 826, 827 and 828 which are each connected in series. The output of inverter 830 provides the Q output. An inverter 832 is connected to the node between the output of inverter 826 and the input of inverter 828. The output of inverter 832 provides the output signal $\overline{Q}$.

The NOR gate 822 and clocked inverter 824 utilize thick oxide PMOS transistors and the transmission gate 820 utilizes a PMOS transistor, but on the NOR gate 822, inverter 824 and inverter 810 need to be connected to $V_{SLP}$ during sleep mode.

DC to DC Boost Converter

Figure 9:
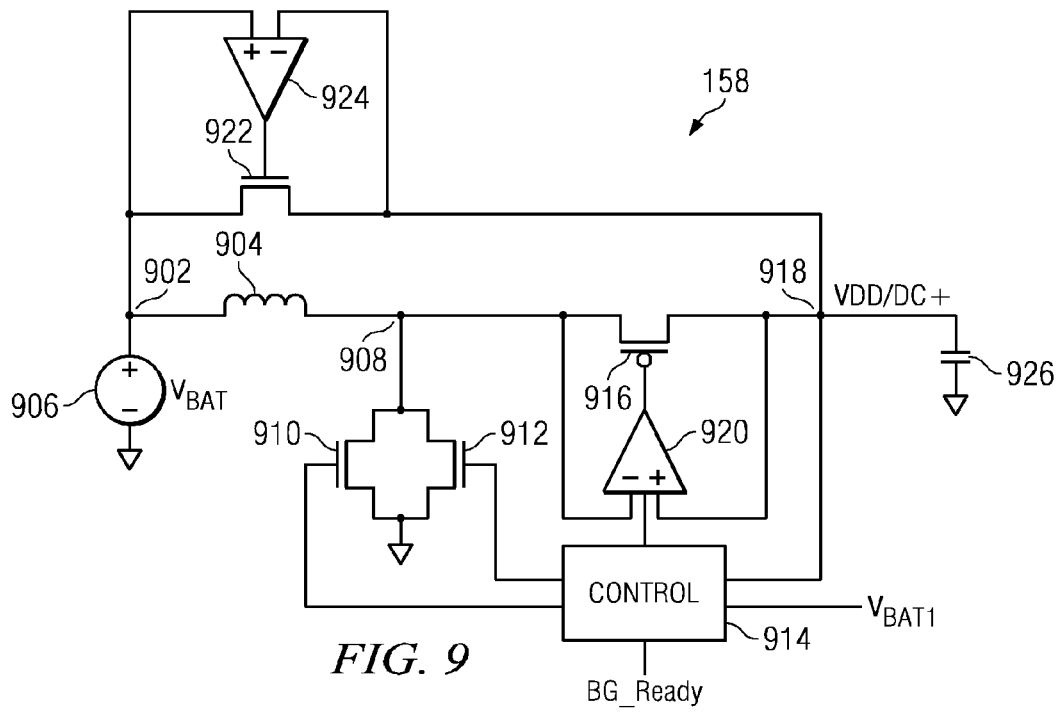
FIG. 9 is a schematic diagram of a DC to DC boost converter.

Referring now to FIG. 9, there is provided a schematic diagram of the DC to DC boost converter circuit 158. The input voltage is applied from node 902, the Vbat node to a first side of an external inductor 904. The input voltage Vbat is provided from a voltage source 906 that may comprise a one cell or two cell battery. Different configurations are utilized for one cell and two cell batteries as will be more fully described herein below. The output of inductor 904 is connected to node 908. The drain/source paths of transistors 910 and 912 are connected between node 908 and ground. The gates of transistors 910 and 912 are connected to receive switching control signals from control logic 914. Transistor 916 is a P-type MOSFET transistor and has its drain/source path connected between node 908 and an output node 918 providing output voltage VDD/DC+ 918. The gate of transistor 916 is connected to the output of a comparator 920. The positive and negative inputs of comparator 920 are connected to nodes 908 and 918 respectively. The comparator 920 receives an enable control signal from the control logic 914. A transistor 922 has its drain/source path connected between node 902, the input node of the DC to DC voltage converter and node 918, the output node of the DC to DC voltage converter. The gate of transistor 922 is connected to the output of a comparator 924. The positive input of comparator 924 is connected to the input voltage node 902 and the negative input of the comparator 924 is connected to the output voltage node 918. A capacitor 926 is connected between the output voltage node 918 and ground. Thus, whenever output node is lower than Vbat on node 902, transistor 922 conducts and charges capacitor 926.

The DC to DC boost converter 158 has settings that can be modified using SFR registers which provide the ability to change the target output voltage, the oscillator frequency or source, resistance of the switches 912 and 916 and specify the minimum duty cycle. The DC to DC boost converter 158 may operate from a single cell battery providing a supply voltage as low as 0.9 volts. The DC to DC boost converter 158 is a switching boost converter with an input voltage range of 0.9 volts to 1.8 volts and a programmable output voltage range of 1.8 volts to 3.3 volts. The programmable output voltage range ranges in steps according to the following: 1.8 volts, 1.9 volts, 2.0 volts, 2.1 volts, 2.4 volts, 2.7 volts, 3.0 volts and 3.3 volts. This enables the programming of the boost converter output voltage to be programmed as low as possible to improve efficiency of the device. The default output voltage is 1.9 volts. The DC to DC boost converter 158 can supply the system with up to 65 milliwatts of regulated power and can be used for powering other devices in the system. The DC to DC boost converter 158 has a built in voltage reference and oscillator and will automatically limit or turn off the switching activity in the event that the peak inductor current rises above a safe limit or the output voltage rises above the programmed target value. This allows the DC to DC boost converter 158 output to be safely overdriven by a secondary power source, when available, in order to preserve battery life. The DC to DC converter is described in U.S. patent application Ser. No. 11/618,433, filed Dec. 29, 2006, entitled "MCU WITH ON-CHIP BOOST CONVERTER CONTROLLER", which is incorporated herein by reference in its entirety.

Figure 10:
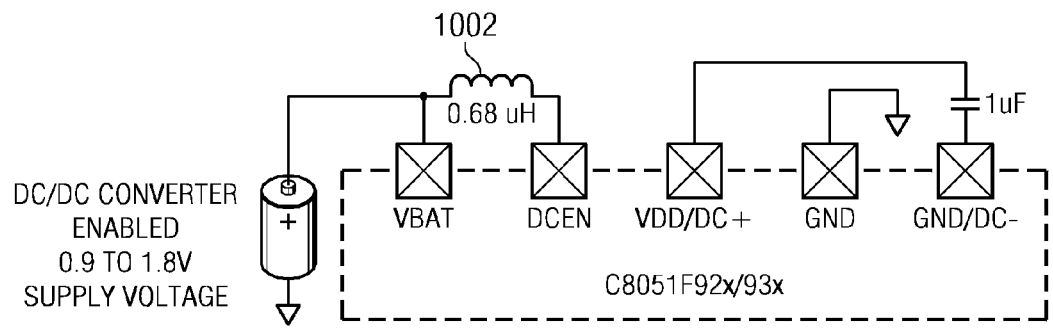
FIG. 10 illustrates the manner for enabling the DC to DC boost converter within the MCU.
Figure 11:
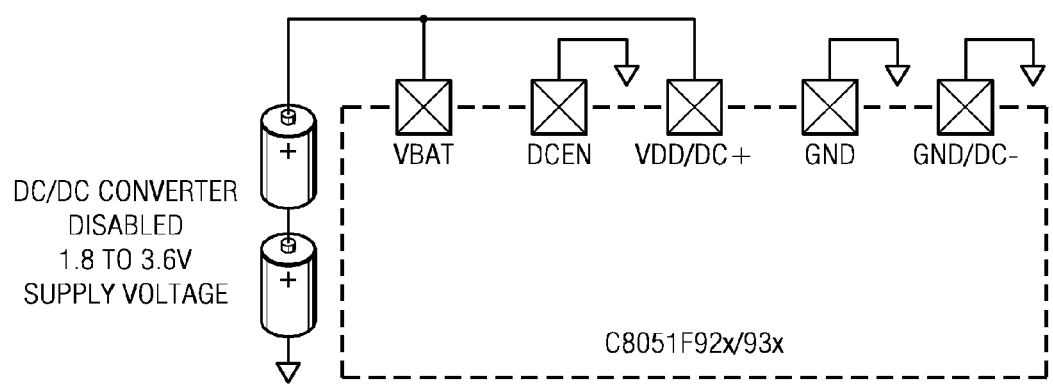
FIG. 11 illustrates the manner for disabling the DC to DC boost converter for an MCU.

Referring now also to FIGS. 10 and 11, the DC to DC boost converter 158 is enabled in hardware by placing an inductor between the DSEN and VBAT pins when the MCU is operating in the single cell mode. The DC to DC boost converter 158 is disabled by shorting the DSEN pin directly to ground when operating in a two cell mode as illustrated in FIG. 11. The DSEN pin should never be left floating. The DC to DC boost converter 158 can only be enabled/disabled during a power on reset.

One problem occurring with a DC to DC boost converter 158 arises when a weak voltage source 906 is provided. A weak battery has a high internal resistance. This high internal resistance imposes high current demands at start up which can cause a collapse of the battery voltage due to detection of this condition by the brownout detector 126. Thus, the start up requirements of the DC to DC boost converter 158 must enable start up when the MCU is powered by a weak battery.

The following table illustrates the control and configuration special function registers (SFR) for the DC to DC boost converter 158:

SFR Definition 13.1 REG0CN: DC/DC Converter Controller

| | Bit | | | | | | |
|---|---|---|---|---|---|---|---|
| 7 | 6 | 5 | 4 | 3 | 2 | 1 | 0 |
| Name MINPW | | SWSEL | Reserved | Reserved | | VSEL | |
| Type R/W | | R/W | R/W | R/W | | R/W | |

SFR Page = 0X0; SFR Address = 0X96

| Bit | Name | Description | Function |
|---|---|---|---|
| 7-6 | MINPW[1:0] | DC/DC Converter Minimum Pulse Width. Specifies the minimum pulse width. See Section 6.3. 00: No minimum duty cycle. 01: Minimum pulse width is 10 ns. 10: Minimum pulse width is 20 ns. 11: Minimum pulse width is 40 ns. | |
| 5 | SWSEL | Diode Bypass Switch Select. Selects one of two available diode bypass switches. 0: The high-current diode bypass switch is selected. 1: The low-current diode bypass switch is selected. | |
| 4-3 | Reserved | Reserved. Always Write to '00'. | |
| 2-0 | VSEL[2:0] | DC/DC Converter Output Voltage Select. Specifies the target output voltage. 000: Target output voltage is 1.8 V. 001: Target output voltage is 1.9 V. 010: Target output voltage is 2.0 V. 011: Target output voltage is 2.1 V. 100: Target output voltage is 2.4 V. 101: Target output voltage is 2.7 V. 110: Target output voltage is 3.0 V. 111: Target output voltage is 3.3 V. | |

SFR Definition 13.2. REG0CF: DC/DC Converter Configuration

| | Bit | | | | | | |
|---|---|---|---|---|---|---|---|
| 7 | 6 | 5 | 4 | 3 | 2 | 1 | 0 |
| Name — | — | — | CLKINV | CLKSKW | CLKDIV | VDDSLP | CLKSEL |
| Type R | R | R | R/W | R/W | R/W | R/W | R/W |
| Reset 0 | 0 | 0 | 0 | 0 | 0 | 0 | 0 |

SFR Page = 0x0; SFR Address = 0x97

-continued

| Bit | Name | Function |
|---|---|---|
| 7-5 | UNUSED | Unused. Read = 0b; Write = Don't Care. |
| 5 | CLKINV | DC/DC Converter Clock Invert<br>Inverts the DC/DC Converter Clock.<br>0: The DC/DC Converter Clock is not inverted.<br>1: The DC/DC Converter Clock is inverted. |
| 4 | CLKSKW | DC/DC Converter Clock Skew.<br>Skews the DC/DC Converter Clock.<br>0: The DC/DC Converter Clock is not skewed.<br>1: The DC/DC Converter Clock is skewed by TBD ns. |
| 3-2 | CLKDIV[1:0] | DC/DC Clock Divider.<br>Divides the DC/DC Converter Clock.<br>00: DC/DC Converter Clock is divided by 1.<br>01: DC/DC Converter Clock is divided by 2.<br>10: DC/DC Converter Clock is divided by 4.<br>11: DC/DC Converter Clock is divided by 8. |
| 1 | VDDSLP | VDD/DC+ Sleep Mode Connection.<br>Specifies the power source for VDD/DC+ in Sleep Mode when the DC/DC converter is enabled.<br>0: VDD/DC+ connected to VBAT in Sleep Mode.<br>1: VDD/DC+ is floating in Sleep Mode. |
| 0 | CLKSEL | DC/DC Converter Clock Source Select.<br>Specifies the DC/DC Converter clock source.<br>0: The DC/DC Converter is clocked from its local oscillator.<br>1: The DC/DC Converter is clocked from the system clock. |

Referring now to FIG. 12, there is illustrated the power connections within the MCU. A single cell or a two cell battery is connected to the input pin Vbat 1202. The single cell battery will provide a voltage from 0.6 volts to 1.8 volts while a two cell battery would provide a voltage from 1.8 volts to 2.6 volts. A boost converter 158 is required to regulate the voltage up to 1.8 volts in the one cell configuration. The input voltage is provided from the boost converter 158 is provided to various analog peripherals 1204 operating within the single chip MCU device, such as that disclosed in co-pending U.S. patent application Ser. No. 11/301,579, entitled "MCU WITH LOW POWER MODE OF OPERATION".

The 1.8 volt signal from the boost converter 158 is also provided to a low drop-out (LDO) regulator 1206. LDO 1206 is a DC linear voltage regulator, which has a very small input/output differential voltage. The LDO regulator 1206 down converts the regulated voltage from the boost converter 158 to a voltage level necessary for operation of the digital peripherals 1208 of the single chip MCU device. When only a single cell battery provides voltages between 0.9 volts and 1.8 volts, the boost converter 158 is necessary to increase the provided voltage to a regulated voltage level necessary to operate the analog peripherals 814 of single chip MCU device. The LDO regulator 1206 is required to lower the voltage to necessary level for operation for the digital peripherals 1208.

If a two cell battery is used as the power source of the single chip MCU, the boost converter 806 is not necessary as a 1.8 volt to 3.6 volt voltage signal is sufficient to operate the analog peripherals 1204 of the single chip MCU device without increasing the applied input voltage. Thus, the switch 1210 is switched from the one cell terminal to the two cell terminal. Thus, the two cell input battery connected to input pin 1210 and is connected directly to the analog peripherals 1204 without passing through the DC to DC boost converter 158. The input battery voltage is also applied directly to the LDO regulator 1206, which down converts the voltage to 1.8 volts for use with the digital peripherals 1208. The ability to selectively disable or enable the boost converter 158, enables a great of flexibility depending on the provided voltage source. The boost converter 158 is disabled when the power source is sufficiently high and enabled when the power is too low to run on-chip peripheral devices.

The output of the DC to DC boost converter 158 in the one cell configuration or of the voltage applied to the Vbat pin 1202 in the two cell configuration is also provided to a series of GPIO pins 1212. The supply voltage applied to the Vbat pin 1202 is also provided to the PMU 1204 and the RTC 114. A switch 1214 switches a random access memory 1216 between a sleep mode terminal and an active/idle/stop/suspend mode terminal. When in the sleep mode, the RAM 1216 is connected to the battery supply voltage through the Vbat pin 1202. When in any of the active/idle/stop/suspend modes of operation, the RAM 1216 is connected to the digital peripherals 1208 and receives the regulated 1.8 volt signal from the LDO 1206. Thus, as can be seen from FIG. 12, the DC to DC boost converter 158, PMU 124 and RTC 114 are always powered directly from the Vbat pin 1202. All analog peripherals 1204 are directly powered from the output of the DC to DC boost converter 158 in the one cell mode or from the Vbat2 pin 1202 in the two cell mode. All digital peripherals in the processing core are powered from the 1.8 volt internal core supply from the LDO 1206. The RAM 1216 is also powered from the core supply in the normal mode, i.e., not in the sleep mode of operation.

Figure 13:
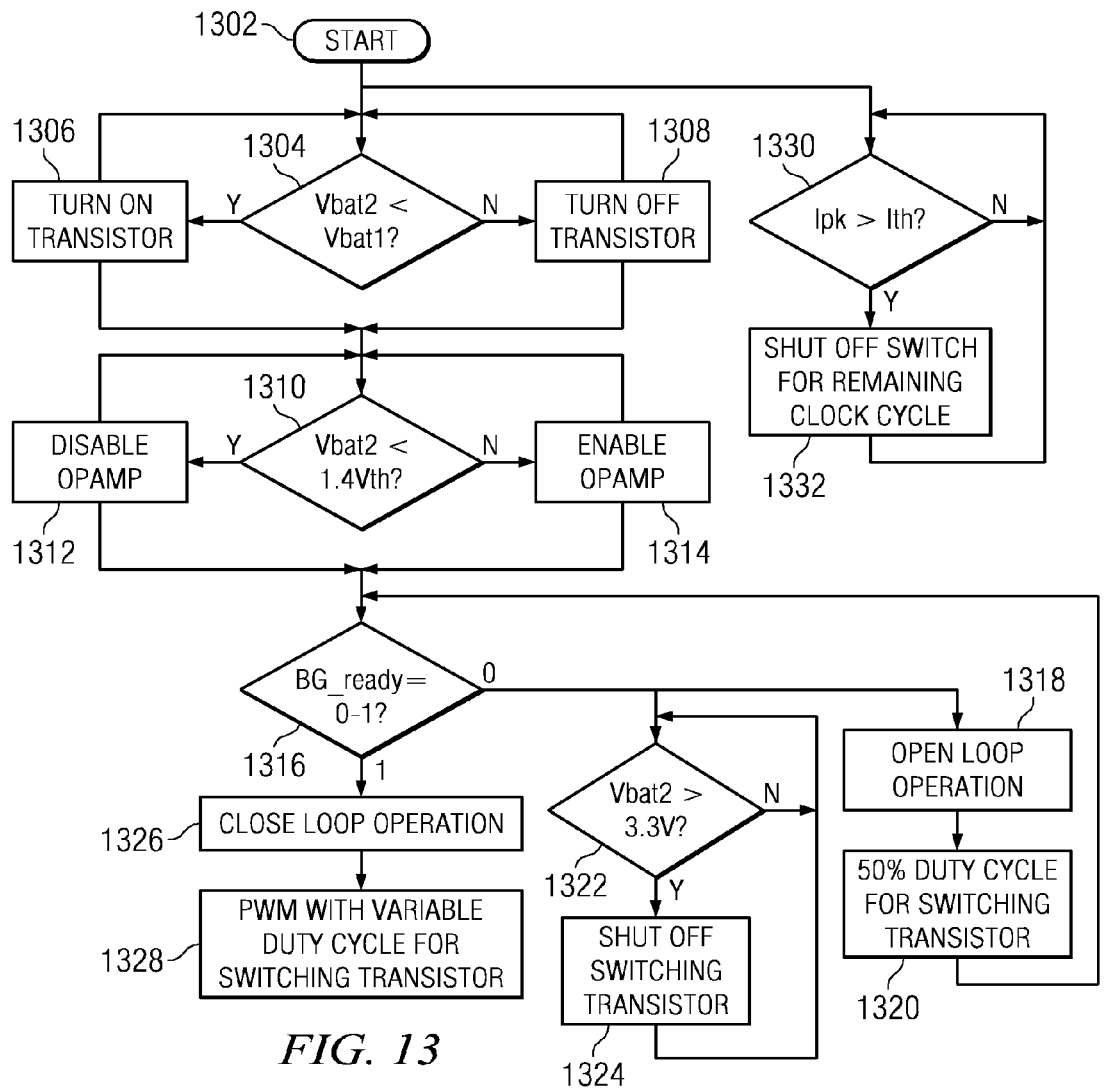
FIG. 13 is a flow diagram illustrating the startup sequence for the DC to DC boost converter.

Referring now to FIG. 13, there is illustrated a flow diagram describing the start up sequence for the DC to DC boost converter 158. Once the process is initiated at step 1302, inquiry step 1304 initially determines if the output voltage Vbat2 (VDD/DC+) is less than the input voltage Vbat1. If Vbat2 is less than Vbat1, transistor 922 is turned on to charge up the output voltage node 918, otherwise transistor 922 is shut off to avoid discharging node 918. Next, inquiry step 1310 determines if Vbat2 is less than 1.4 times the threshold voltage of switching transistor 912. If so, the control logic 114 generates a signal to opamp 920 to disable the opamp at step 1312 and the operation of transistor 916 is directly controlled by the same signal as that of transistors 910 and 912, i.e., it becomes a gate control for transistor 916. If inquiry step 1310 determines that Vbat is not less than 1.4 times the threshold voltage of switching transistor 912, the opamp 920 is enabled by the control logic 914 at step 1314 and the operation of transistor 916 is controlled by the opamp 920.

Inquiry step 1316 determines if the band gap reference is ready based upon the bg_ready signal provided by the voltage monitor circuit. If it is not ready, (i.e., bg_ready=0), the DC to DC boost converter 158 is set to open loop operation at step 1318. A fixed 50% duty cycle is used at step 1320 to drive the switching transistors 910 and 912. Inquiry step 1322 monitors the output voltage Vbat2 to determine if it is greater than 3.3 volts. No action is taken if this voltage is not exceeded. When the output voltage Vbat2 exceeds 3.3 volts the over-voltage protection circuitry shuts off the switching transistors 912 and 910. If the inquiry step 1316 determines the band gap reference is ready (i.e., bg_ready=1) the DC to DC boost converter 158 is run in a closed loop configuration at step 1326, and the switching transistor 912 is driven by a pulse width modulation signal with a variable duty cycle at step 1328.

During the start up sequence, inquiry step 1330 determines if the peak inductor current is greater than a current threshold defined in the SFR registers in each clock cycle. If so, the switching transistors 910 and 912 are shut off for this clock cycle at step 1332. Transistor 910 is a medium Vt device relative to transistor 912 and is utilized instead of transistor 912, used as the threshold of the transistor 912 is too high at low temperature for weak battery input during start up.

Figure 14:
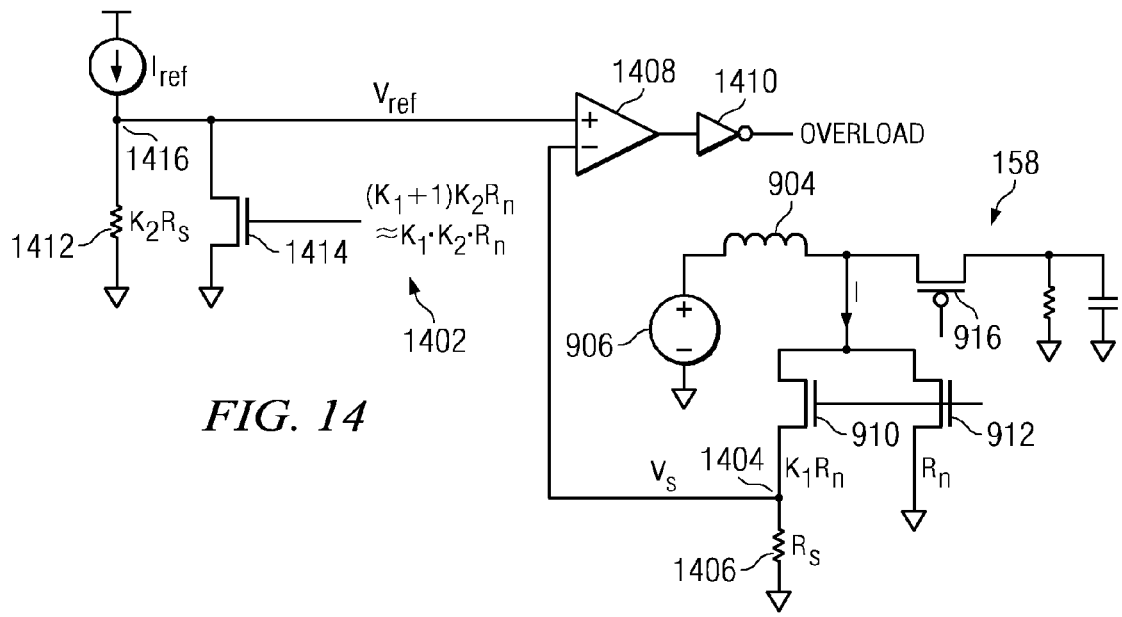
FIG. 14 is an illustration of DC to DC current sensing circuitry for use with the DC to DC boost converter of FIG. 9.

Referring now to FIG. 14, there is illustrated DC to DC current sensing circuitry which may be used in combination with the DC to DC boost converter 158 in order to limit the current (I) passing through the inductor 904 of the DC to DC boost converter 158. The current sense circuitry 1402 is connected to the DC to DC boost converter 158 at node 1404 between the source of transistor 910 and resistor 1406. The current sensing circuit 1402 comprises a comparator 1408 having its output connected to an inverter 1410 which provides an overload indication when the current (I) through the inductor 904 exceeds a desired value. The overload signal provided from the output of the inverter 1410 provides the indication of whether to shut down the switching operation of transistor 916 by the control circuit 914 (FIG. 9) by disabling opamp 920 when the desired current values are exceeded. The inverting input of the comparator 1408 is connected to node 1404 to sense the source voltage $V_s$ of transistor 910.

The resistance $R_s$ between node 1404 and ground is approximately 500 ohms and provides for easy layout and matching. Thus, the power efficiency losses due to $R_s$ are relatively small. The non inverting input of the comparator 1408 receives a reference voltage $V_{ref}$ which is compared to the voltage $V_s$ applied from node 1404. A reference current $I_{ref}$ is generated by a current source 1415 to drive a node 1416. Node 1416 is connected to the non-inverting input of comparator 1408. A resistor 1412 is connected between the non inverting input of comparator 1408 and ground to generate $V_{REF}$. Likewise, the transistor 1414 has its drain/source path connected between the non inverting input of the comparator 1408 and ground. Transistors 912, 1418 and 1414 have the same gate control signal from control circuit 914 (FIG. 9).

The value $R_n$ associated with the switching transistor 912 is the turn on resistance of this switching resistor 912. $k_1 R_n$ is the turn on resistance of transistor 910. $k_1 R_n$ and $(k_1+1)k_2 R_n$ is the turn on resistance of the transistor 1414, with constants $k_1$ and $k_2$ denoting the relative sizes of the transistors. Thus, a determination of when the overload signal is triggered may be generated is made according to the following equations:

$$V_{ref} = I_{ref} \cdot (k_2 \cdot R_s) \| (k_1 + 1)k_2 R_n = \frac{I_{ref} k_2 \cdot (k_1 + 1) R_s \cdot R_n}{R_s + (k_1 + 1) R_n}$$

$$V_s = \frac{I \cdot R_s \cdot R_n}{R_s + (k_1 + 1) R_n}$$

$$\therefore \text{ when } I > k_2(k_1 + 1)I_{ref} \text{ overload signal is triggered.}$$

Using the above described current sensing circuitry 1402 there is no need to build tiny resistors to sense the current (I) flowing through the inductor 904. The $V_s$ node 1404 and the $V_{ref}$ node 1416 are low impedance nodes regardless of when the switching transistor 912 is turned on or off.

Figure 15:
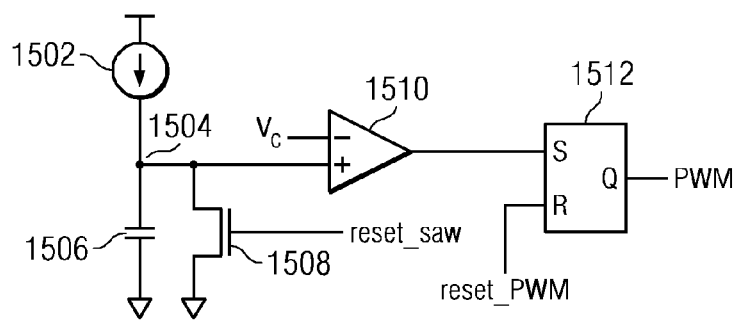
FIG. 15 illustrates pulse skipping circuitry for generating a PWM signal for application to the DC to DC boost converter circuit.

Referring now to FIG. 15, there is illustrated the pulse skipping circuitry for generating the pulse width modulated (PWM) signal that is applied to the switching transistor 912 of the DC to DC boost converter 158. A current source 1502 is connected between system power and node 1504. A capacitor 1506 is connected between node 1504 and ground. A switching transistor 1508 is connected between node 1504 and ground and has a signal reset saw provided by the control circuit 914 (FIG. 9) applied to the gate of the transistor 1508. Node 1504 is connected to the positive input of a comparator 1510. The negative input of the comparator 1510 is connected to a control signal $V_c$. The control signal $V_c$ is provided from the compensator output which is positively related to the DC to DC boost converter 158 output. The output of the comparator 1510 is applied to the S input of an SR latch 1512. The signal reset_pwm provided by the control circuit 914 (FIG. 9) is applied to the R input of the SR latch 1512. The output Q of the SR latch 1512 comprises the PWM signal which is applied to the switching transistor 912 of the DC to DC boost converter 158 through some type of buffer.

Figure 16:
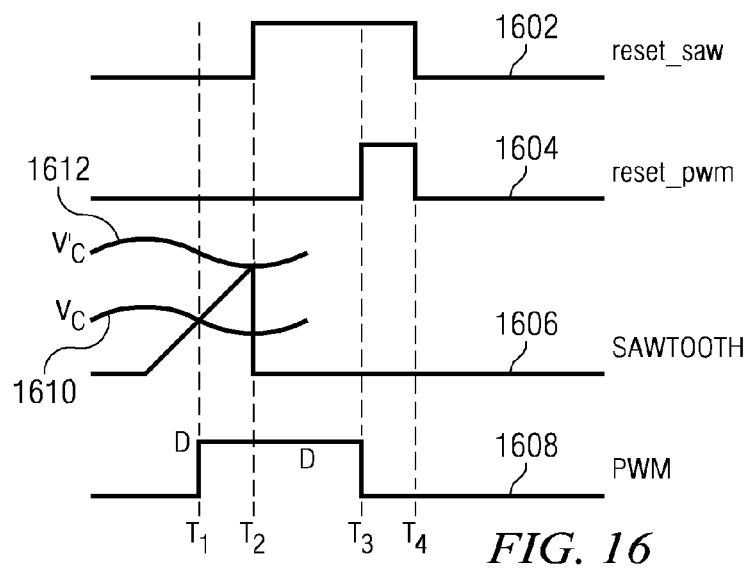
FIG. 16 is a timing diagram illustrating the operation of the pulse skipping circuitry of FIG. 15.

FIG. 16 illustrates a timing diagram describing the operation of the signals applied to the automatic pulse skipping operation. The reset_saw signal 1602 illustrated by a waveform having a rising edge 1610 that occurs a minimum amount of time prior to the rising edge 1612 of the reset height_PWM signal 1604. This minimum pulse width is set forth in the configuration registers. For example, if the minimum pulse width were 10 ns, then the rising edge 1610 would be generated 10 ns prior to rising edge 1612. This would reset the output of the saw generator to 0, as indicated by the waveform 1606, wherein a falling edge 1614 of the saw tooth would occur. However, if the saw tooth voltage were compared to the waveform 1610 and a control voltage $V_C$, and that voltage comparison occurred prior to rising edge 1610 then the saw tooth waveform 1606 would result in the output of comparator 1510 going high and generating a pulse edge 1620 on the PWM output waveform 1608. Since this occurred prior to the edge 1610, the pulse would be generated at the reset edge 1612. Therefore, at a time $T_1$, the positive input of the comparator 1510 exceeded the $V_C$ input and generated the rising edge 1620. There is also illustrated a second control signal 1612 that corresponds to a DC output voltage that is higher than the positive input of the comparator 1510 when the reset signal 1610 is generated. As such, since this occurs after the minimum pulse width, there will be no pulse generated for this result in pulse skipping, i.e., there will be no pulse generated since the pulse cannot exceed the minimum pulse width. This is essentially an automatic pulse skipping method.

Real Time Clock

Figure 17:
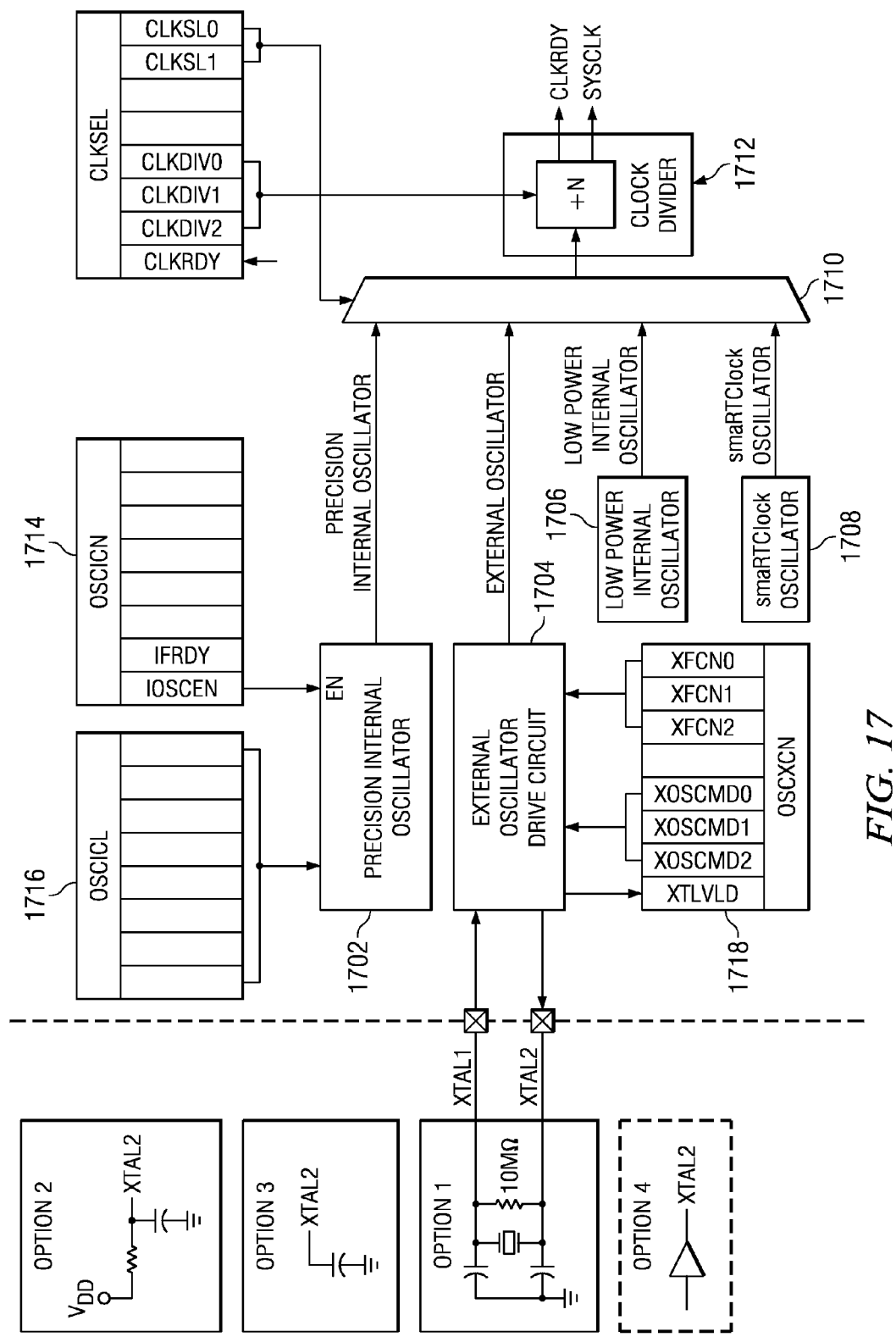
FIG. 17 is a block diagram illustrating the various clock sources of the MCU.

Referring now to FIG. 17, there is illustrated a block diagram of the clocking sources of the MCU. The MCU includes a programmable precision internal oscillator 1702, an external oscillator drive circuit 1704, a low power internal oscillator 1706 and a real time clock oscillator 1708. Each of these clock signals are applied to a multiplexer 1710. The output of the multiplexer 1710 is applied through a clock divider circuit 1712. The precision internal oscillator 1702 can be enabled/disabled and calibrated using the OSCICN register 1714 and the OSCICL register 1716. The external oscillator is configured using the OSCXCN register 1718. The low power internal oscillator is automatically enabled and disabled when selected and deselected as a clock source. The system clock signal is provided from the clock divider circuit 2717. The clock divider circuit can generate a system clock that is 1, 2, 4, 8, 16, 32, 64 or 128 times slower than the selected input clock source.

The precision internal oscillator 1702 supports a spread spectrum mode which modulates the output frequency in order to reduce the EMI generated by the system. When the spread spectrum mode is enabled, the output oscillator frequency is modulated by a triangle wave form having a frequency equal to the oscillator frequency divided by 1024. The maximum deviation from the center frequency is plus or minus 1%. The output frequency updates every 128 clock cycles and the step size is typically 0.25% of the center frequency. The low power internal oscillator 1706 defaults as the system clock after a system reset. The low power internal oscillator frequency is 20 MHz plus or minus 10% and is automatically enabled when selected as the system clock and disabled when not in use.

The external oscillator drive circuit 1704 may drive an external crystal, ceramic resonator, capacitor or RC network. A CMOS clock may also provide a clock input. FIG. 17 illustrates the four external oscillator options for the external oscillator drive circuit 1704. The external oscillator drive circuit 1704 is enabled and configured using the OSCXCN register 1718. The external oscillator drive circuit output may be selected as a system clock or used to clock some of the digital peripherals of the MCU.

Figure 18:
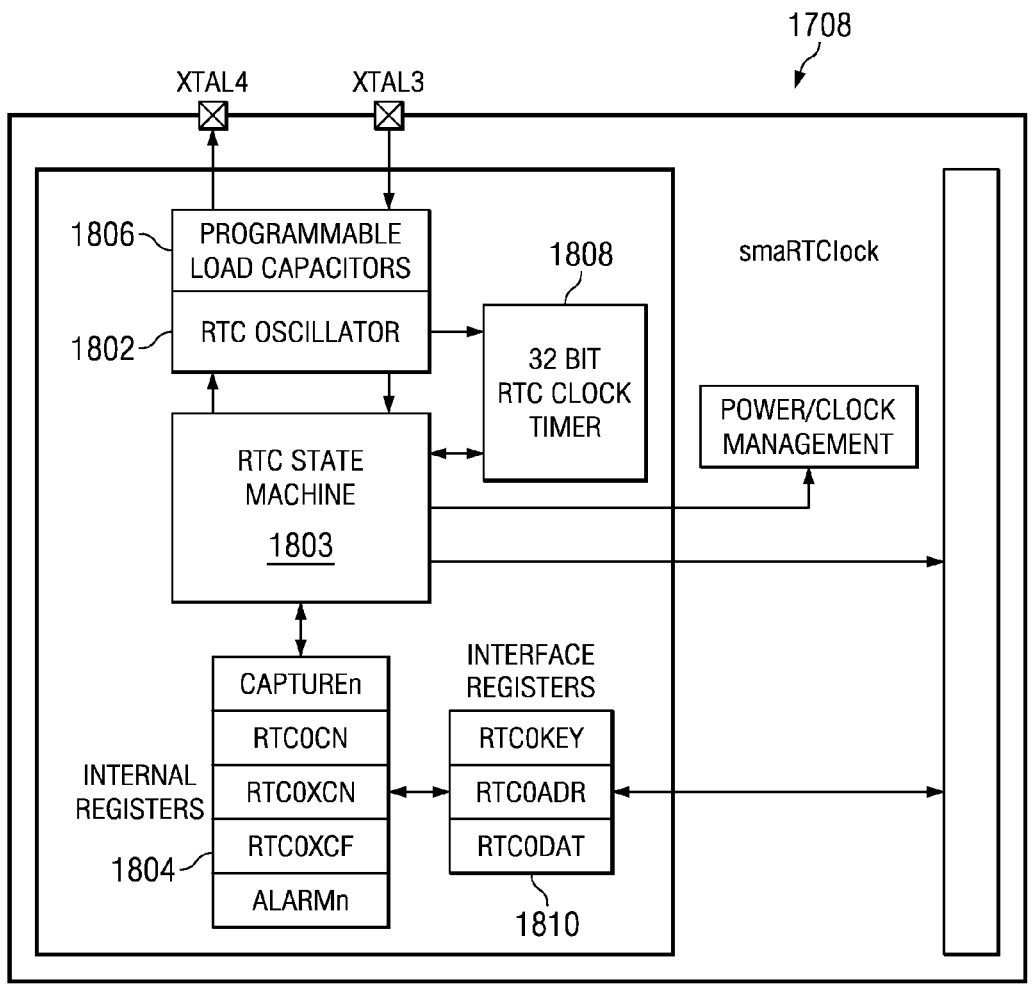
FIG. 18 is a block diagram of the real time clock circuit.

Referring now to FIG. 18, there is provided a block diagram of the real time clock circuit. The real time clock (RTC) 1708 is an ultra low power 32-bit real time clock with alarm. The real time clock 1708 has a dedicated 32 kHz oscillator 1802 that can be configured for use with or without a crystal from various internal registers 1804. No external resistor or loading capacitors are required. The on-chip loading capacitors 1806 are programmable to 16 discreet levels allowing compatibility with a wide range of crystals. The RTC can operate directly from a 0.9 volt to 3.6 volt battery voltage and remains operational even when the device goes into its lowest power down mode.

The RTC 1708 allows a maximum of 36 hour 32 bit independent time keeping using a 32 bit timer 1708 when used with a 32.768 kHz watch crystal. The real time clock 1708 provides an alarm and missing real time clock events, which is used as a reset or wake up source. A number of interface registers 1810 provide access to the RTC internal registers 1804. The interface registers include the RTC0KEY register which must have a correct key code written therein in sequence before write or read operations may be performed to the address and data registers of the interface registers 1810. The RTC0ADR register enables selection of a particular internal register that will be targeted for a Read or Write operation and the data to be read or written is provided through the RTC0DAT register of the interface registers 1810. The programmable load capacitors 1806 have 16 programmable values to support crystal oscillators with recommended load capacitance from 4.0 pF to 13.5 pF. If automatic load capacitance stepping is enabled, the crystal load capacitors start at the smallest setting to allow a fast start up time, and then slowly increase the capacitance until the final program value is reached. The final program loading capacitor value is specified using the load cap BITS in the RTC0XCF register of the internal registers 1804. Once the final program loading capacitor value is reached the LOADRDY flag will be set by hardware to a logic one.

When using the RTC 1708 in self oscillate mode, the programmable load capacitors 1806 can be used to fine tune the oscillation frequency. In most cases, increasing the load capacitor value will result in a decrease in the oscillation frequency. The programmable load capacitors 1806 may be changed up or down from the original setting to a new setting to compensate for temperature variations without a clock interrupt.

Figure 19:
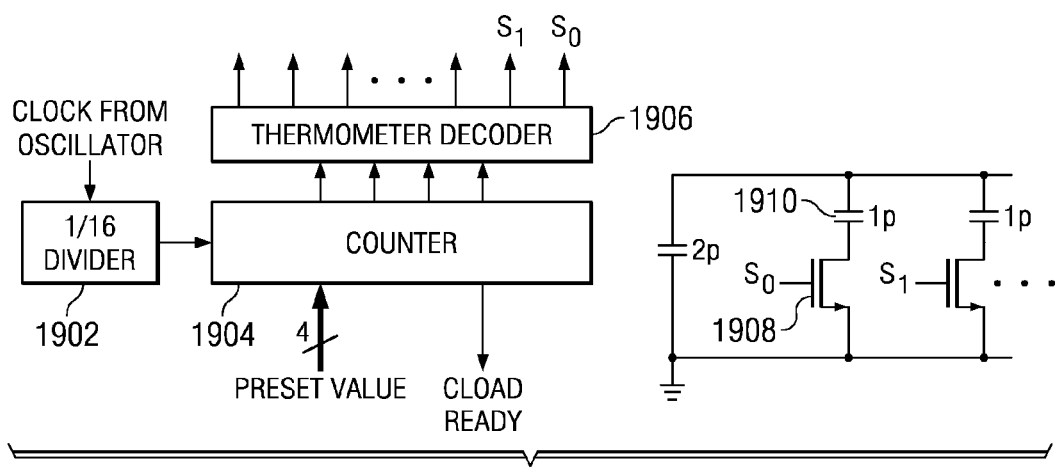
FIG. 19 is a block diagram of the programmable load capacitor circuit.

Referring now to FIG. 19, there is illustrated the circuitry for providing the programmable load capacitors 1806. The circuitry of FIG. 19 allows the bias current in the oscillator to be set to a very low value while allowing the value of the oscillator load capacitance to be programmed on the fly to perform temperature compensation, for example, without killing the oscillation of the circuit. Without this capability, the bias current would need to be higher to ensure that the oscillations continued when the load capacitance of the circuit changed. The programmable load capacitor circuitry 1806 includes a 1/16 divider circuit 1902 that receives a clock signal from the RTC oscillator 1802. The divided clock signal is provided to a counter circuit 1904 that also receives a set of preset values from the state machine 1803. The variable capacitance increases or decreases one step from the original value to the preset value every 16 periods of the clock from the oscillator. When the counter value reaches the preset value, the C load ready signal goes high. The counter 1904 provides a four bit signal to the thermometer decoder circuit 1906 which generates control values to the gates of transistor switches 1908 connected to a series of capacitors connected in parallel. The output code of the thermometer decoder 1906 is provided to each of the gates of the transistors 1908 to connect various capacitors 1910 of the programmable capacitor array.

An additional manner in which the real time clock 1708 may improve power operations of the MCU is by programming the bias current of the internal oscillator 1802 at production. The RTC is required to work with a low bias current. However, with transistor process variations, resistor processes variation and transistor mismatch, the current can vary from −40% to +50% in the worst corners. To control the current in a lighted range, and ensure that RTC bias current can be set to the lowest possible value which guarantees operation under all operating conditions, the below described system is used. The oscillator bias current is calibrated during production tests to enable it to be set to the lowest possible value that guarantees operation over all operating conditions.

Figure 20:
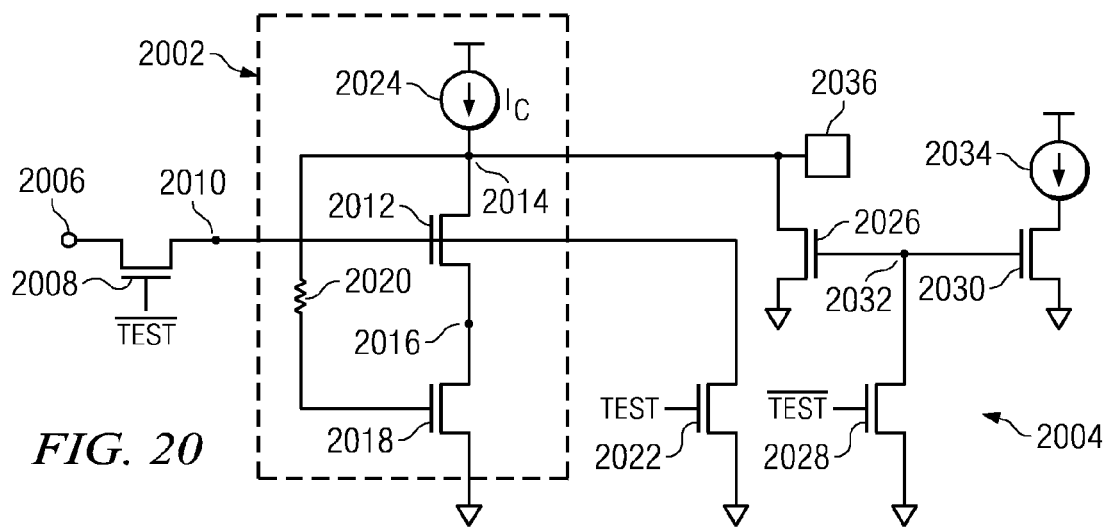
FIG. 20 is a schematic diagram of the RTC oscillator circuit including internal circuitry enabling production test setting of the oscillator bias current.

Referring now to FIG. 20, there is illustrated how the RTC oscillator circuit 2002 uses an internal current comparator 2004 to convert the small RTC oscillator bias current to a voltage that can be quickly and easily measured by a low cost production tester. Input voltage is applied to node 2006 across a transistor 2008. The gate of transistor 2008 is connected to receive a test signal. The drain/source path of transistor 2008 is connected between node 2006 and node 2010. The gate of transistor 2012 is also connected to node 2010. Transistor 2012 has its drain/source path connected between node 2014 and node 2016. Transistor 2018 has its drain/source path connected between node 2016 and ground. The gate of transistor 2018 is connected to a resistor 2020. The other side of resistor 2020 is connected to node 2014. The transistor 2022 is connected between node 2010 and ground. The gate of transistor 2020 is connected to receive the test signal. The oscillator current is provided by current source 2024 connected between system power and node 2014. The current mirror consists of transistors 2026, 2028 and 2030. Transistor 2026 is connected between node 2014 and ground. The gate of transistor 2026 is connected to the drain of transistor 2028 and the drain/source path of transistor 2028 is connected between node 2032 and ground. The gate of transistor 2028 is connected to receive the signal bar test. Transistor 2030 has its gate connected to the gate of transistor 2026 at node 2032 and its drain/source path connected between a band gap current source 2034 and ground. The test pad 2036 provides the response to calibration signals applied via the band gap current source 2034.

In test mode, i.e., test=1, the transistor 2012 within the oscillator circuit 2002 is turned off, disabling the oscillator. The oscillator bias current IC from current source 2024 is then conducted to the test current mirror 2004 for comparison with an accurate current provided by the band gap test current source 2034. If the oscillator current from current source 2024 is larger than the band gap current source 2034, the voltage on the voltage pad 2036 will go high. If the oscillator current from current source 2024 is lower than the band gap current source 2034, the voltage on the voltage pad 2036 will go to zero. The current source 2024 may then be calibrated to be approximately equivalent to the band gap current source 2034 that is desired. This is facilitated by trimming a resistor in the bias circuit to which the current source 2024 is mirrored.

Figure 21:
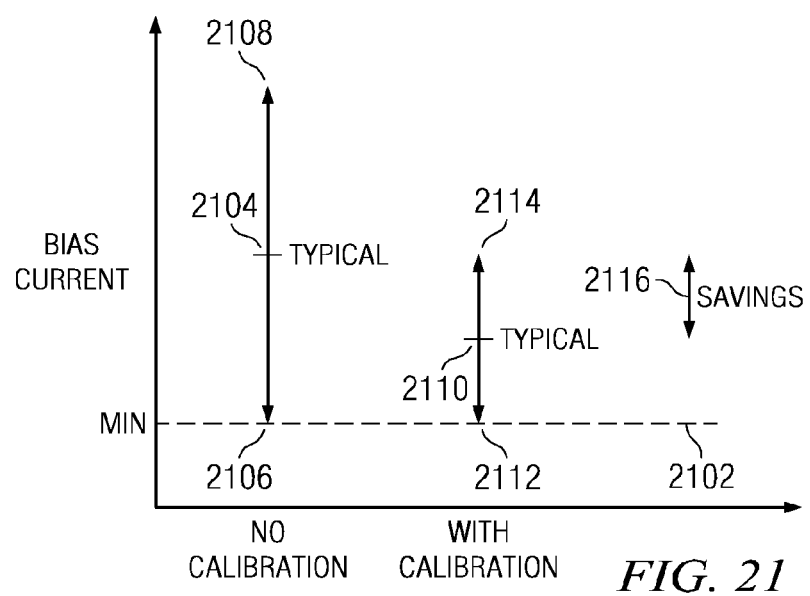
FIG. 21 illustrates the bias current savings utilizing a production calibration of the RTC oscillator circuit.

Referring now to FIG. 21, there is illustrated the manner in which the bias current may be lowered within the oscillator circuit using the calibration process described with respect to FIG. 20. Line 2102 indicates the minimum value that an oscillator bias current may be set at and still provide operation over the range of differences present in different circuits. If the bias current is not calibrated, the typical bias current value will be as indicated at 2104. The range of bias currents resulting from component variation may range from the minimum value at 2106 to a maximum value at 2108. By calibrating the bias currents of the oscillator to a much lower bias current value at 2110, the range of values over which the bias current will range is much reduced from a minimum value of 2112 to a maximum value of 2114. In the example illustrated in FIG. 21, between no calibration and with calibration of bias currents, a savings represented generally by 2116 may be achieved by lowering of the typical bias current. By lowering the bias current of the oscillators, the power consumption of the overall MCU circuit may be greatly reduced. Thus, the benefits of the calibration procedure at production described with respect to FIG. 20 are readily apparent.

Comparators

Figure 22:
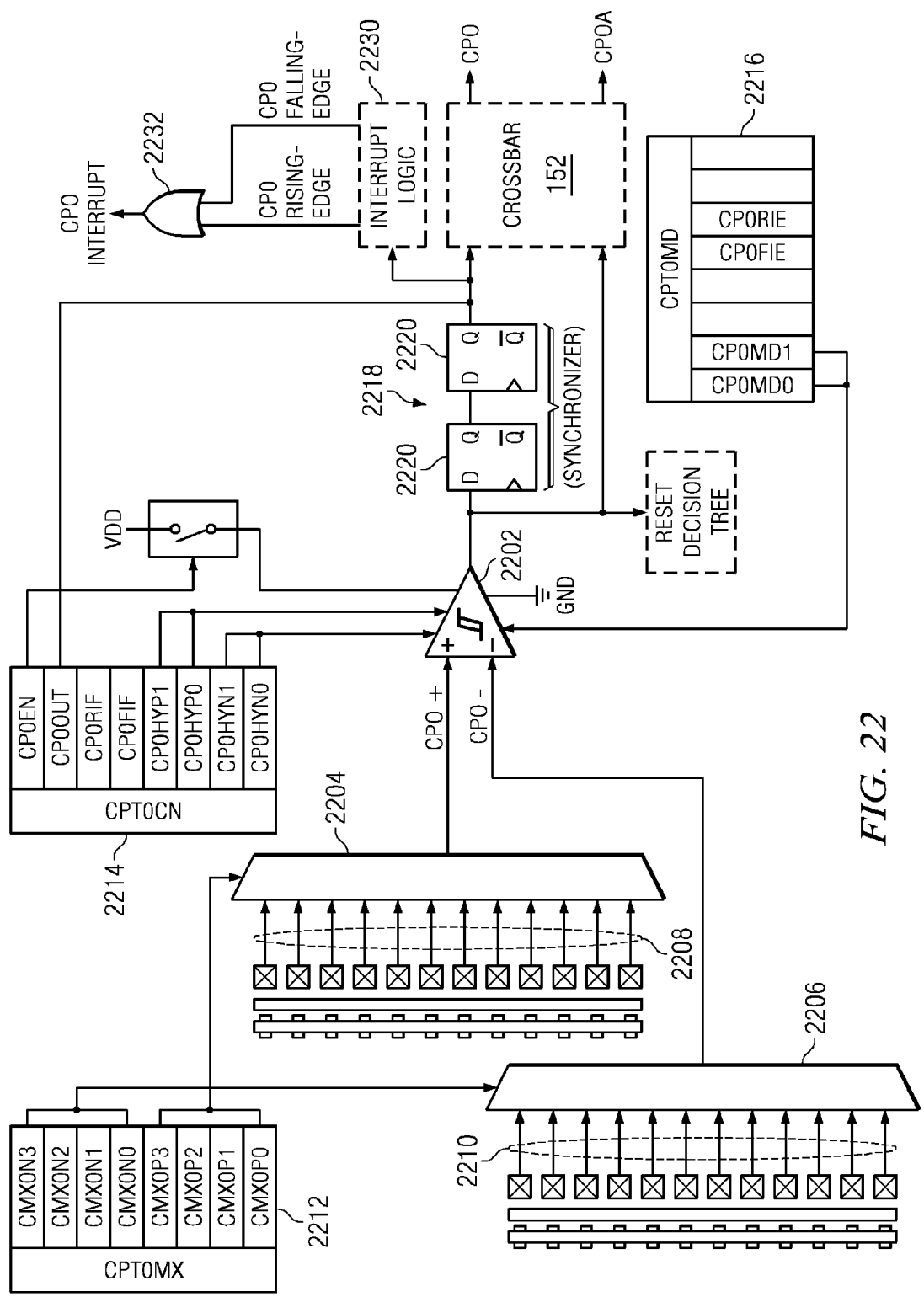
FIG. 22 illustrates the comparators for use with the MCU of FIG. 1.

Referring now to FIG. 22, the MCU of the present disclosure makes use of general purpose comparators 2202 having multiplexers 2204 and 2206 connected to each of its positive and negative inputs respectively. The multiplexers 2204 and 2206 provide one of a plurality of inputs 2208 and 2210, respectively, on the output of the multiplexers 2204 and 2206 responsive to control inputs received from a SFR register 2212. Additional SFR registers 2214 and 2216 provide control inputs to the comparator 2202.

The comparator 2202 comprises an on-chip programmable voltage comparator. The comparator 2202, responsive to the control inputs from SFRs 2214 and 2216, offers programmable response time and hysteresis, an analog input multiplexer, and two outputs that are optionally available at the port pins for an asynchronous output. The asynchronous output is available even when the system clock is not active. This enables the comparator 2202 to operate and generate an output when the device is in low power modes.

The comparator 2202 performs an analog comparison of the voltage levels at its positive input and negative input. The comparator supports multiple port pin inputs multiplexed via multiplexers 2204 and 2206 to the positive and negative inputs of the comparator 2202. The analog input multiplexers 2204 and 2206 are under software control configured using the SFR register 2212.

The asynchronous comparator output is synchronized with the system clock using synchronizer circuit 2218 consisting of a pair of latches 2220. Comparator response time may be configured in software via the SFR register 2216. Full response time setting are available at mode 0 (fastest response time), mode 1, mode 2, and mode 3 (lowest power). Setting a longer response time reduces the comparator active supply current. The comparator also has a low power shut down state, which is entered anytime the comparator is disabled.

The comparator 2202 further features software programmable hysteresis that can be used to stabilize the comparator output while a transition is occurring on the input. Using the SFR register 2214, a user can program both the amount of hysteresis voltage (input voltage) and the positive and negative outgoing symmetry of this hysteresis around the threshold voltage. When positive hysteresis is enabled, the comparator 2202 output does not transition from logic 0 to logic 1 until the comparator positive input voltage has exceeded the threshold voltage by an amount equal to the programmed hysteresis value. When negative hysteresis is enabled, comparator output does not transition from logic 1 to logic 0 until the comparator positive input voltage has fallen below the threshold voltage by an amount equal to the programmed hysteresis.

Each of the multiplexers 2204 and 2206 are configured to interface with the I/O ports to receive an analog signal. Since these I/O ports can be configured to be either a digital bidirectional port or an analog input port, they must be configured as analog ports such that they constitute an input analog port. The configuration for each of these pads is disposed in U.S. Pat. No. 6,885,219, issued Apr. 26, 2005, and titled PROGRAMMABLE DRIVER FOR AN I/O PIN OF AN INTEGRATED CIRCUIT, which is incorporated herein by reference in its entirety. These analog inputs are each connected to capacitive touch sensors which in general comprises a capacitor connected to ground. With multiple input ports, multiple capacitor pads can be accommodated in an array. However, only one of the multiplexers 2204 or 2206 will be associated with the capacitor array wherein the other input will be the reference, as will be described herein below.

The comparator 2202 can have the output thereof monitored with the SFR 2214 on the CP0OUT bit. This is a read bit which basically reads the value of the output to determine if it is a logic "1" or a logic "0." The output is also input to one input of crossbar 152 on the output of the synchronizer circuit 2218. The output can also be directly input to the crossbar 152 for the synchronizer. This output can then, for the purpose of monitoring charge and discharge times of a capacitive input circuit, to one of the multiple timers. Each of the timers can be controlled to time the distance between a logic "1" and a logic "0." This is effected by starting the timer when the signal goes high and turning the timer when it goes low. This then provides a measure of time for calculating an oscillator time period.

In addition to providing an output to the crossbar 152, the output from the synchronizer 2218 can be input to interrupt logic 2230, which is utilized to drive an OR gate 2232 with the rising edge of the output and the falling edge. This generates an interrupt signal for use by the interrupt handler.

The register descriptions for the control register 2212 and the mode selection register 2214 are described in the following two tables:

SFR Definition 5.1. CPT0CN: Comparator 0 Control

| | | | Bit | | | | |
|---|---|---|---|---|---|---|---|
| 7 | 6 | 5 | 4 | 3 | 2 | 1 | 0 |
| CP0EN | CP0OUT | CP0RIF | CP0FIF | CP0HYP[1:0] | | CP0HYN[1:0] | |
| R/W | R | R/W | R/W | R/W | | R/W | |
| 0 | 0 | 0 | 0 | 0 | 0 | 0 | 0 |

Name / Type / Reset in rows above.

SFR Page = 0x0; SFR Address = 0x9B

| Bit | Name | Function |
|---|---|---|
| 7 | CP0EN | Comparator0 Enable Bit.<br>0: Comparator0 Disabled.<br>1: Comparator0 Enabled. |
| 6 | CP0OUT | Comparator0 Output State Flag.<br>0: Voltage on CP0+ < CP0−.<br>1: Voltage on CP0+ > CP0−. |
| 5 | CP0RIF | Comparator0 Rising-Edge Flag. Must be cleared by software.<br>0: No Comparator0 Rising Edge has occurred since this flag was last cleared.<br>1: Comparator0 Rising Edge has occurred. |
| 4 | CP0FIF | Comparator0 Falling-Edge Flag. Must be cleared by software.<br>0: No Comparator0 Falling-Edge has occurred since this flag was last cleared.<br>1: Comparator0 Falling-Edge has occurred. |
| 3-2 | CP0HYP[1:0] | Comparator0 Positive Hysteresis Control Bits.<br>00: Positive Hysteresis Disabled.<br>01: Positive Hysteresis = 5 mV.<br>10: Positive Hysteresis = 10 mV.<br>11: Positive Hysteresis = 20 mV. |
| 1-0 | CP0HYN[1:0] | Comparator0 Negative Hysteresis Control Bits.<br>00: Negative Hysteresis Disabled.<br>01: Negative Hysteresis = 5 mV.<br>10: Negative Hysteresis = 10 mV.<br>11: Negative Hysteresis = 20 mV. |

SFR Definition 5.2. CPT0MD: Comparator 0 Mode Selection

| | | | Bit | | | | |
|---|---|---|---|---|---|---|---|
| 7 | 6 | 5 | 4 | 3 | 2 | 1 | 0 |
| — | — | CP0RIE | CP0FIE | — | — | CP0MD[1:0] | |
| R | R | R/W | R/W | R | R | R/W | |
| 0 | 0 | 0 | 0 | 0 | 0 | 1 | 0 |

SFR Page = All Pages; SFR Address = 0x9D

| Bit | Name | Function |
|---|---|---|
| 7-6 | UNUSED | UNUSED.<br>Read = 00b, Write = don't care. |
| 5 | CP0RIE | Comparator0 Rising-Edge Interrupt Enable.<br>0: Comparator0 Rising-edge interrupt disabled.<br>1: Comparator0 Rising-edge interrupt enabled. |
| 4 | CP0FIE | Comparator0 Falling-Edge Interrupt Enable.<br>0: Comparator0 Falling-edge interrupt disabled.<br>1: Comparator0 Falling-edge interrupt enabled. |
| 3-2 | UNUSED | UNUSED.<br>Read = 00b, Write = don't care. |
| 1-0 | CP0MD[1:0] | Comparator0 Mode Select<br>These bits affect the response time and power consumption for Comparator0.<br>00: Mode 0 (Fastest Response Time, Highest Power Consumption)<br>01: Mode 1<br>10: Mode 2<br>11: Mode 3 (Slowest Response Time, Lowest Power Consumption) |

[The comparator 2202 is enabled with a switch 2236 which powers the comparator 2202 from the VDD as a result of an enabled bit in the mode control register 2214. In addition, the hysteresis is defined in the mode control register by two bits for positive and two bits for negative.]

Figure 23:
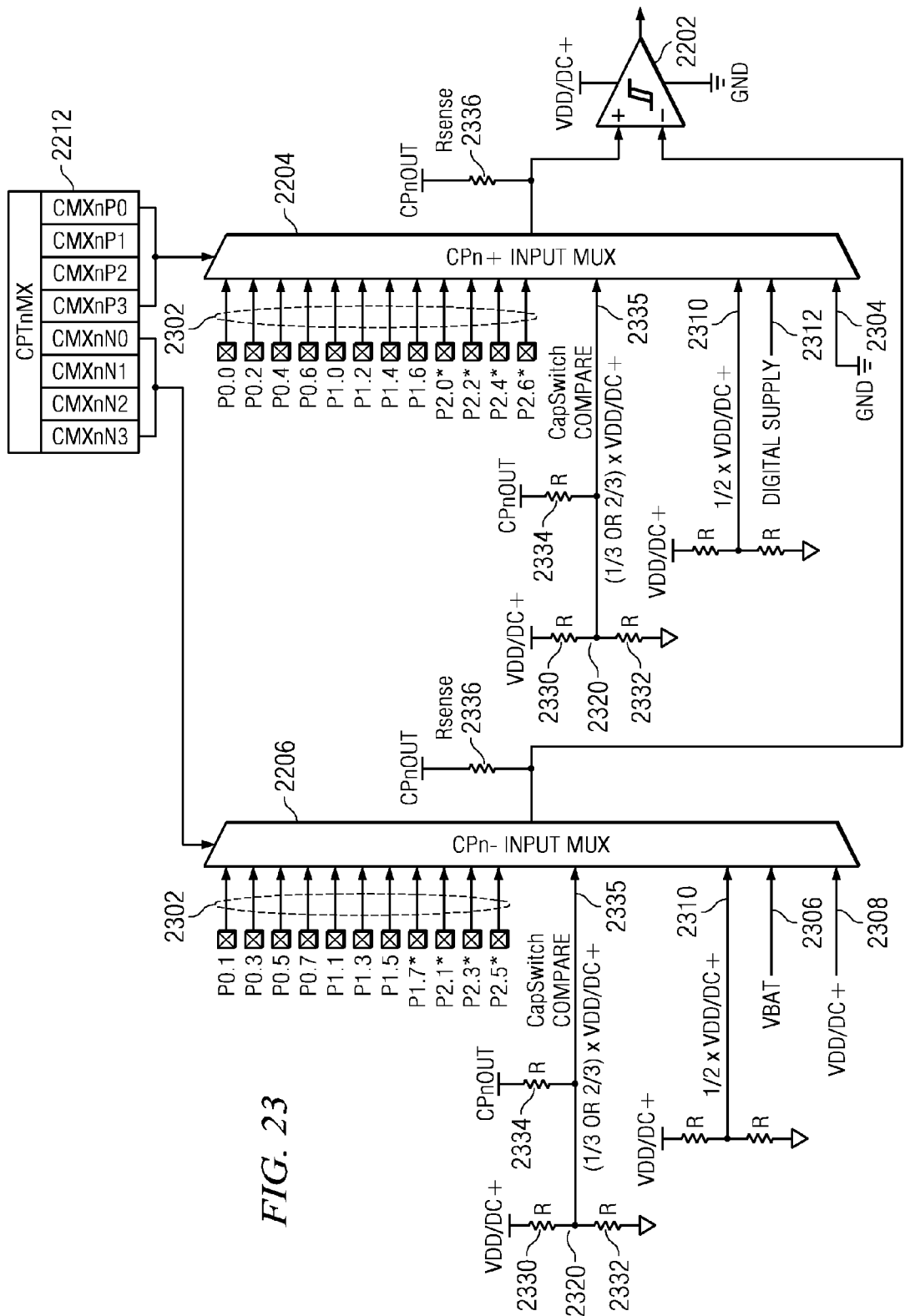
FIG. 23 illustrates the multiplexer circuits connected to the input of the comparator of FIG. 22.

Referring now to FIG. 23, there is more fully illustrated the inputs of the analog multiplexers 2204 and 2206 connected to the positive and negative inputs of comparator 2202. The analog multiplexers 2204 and 2206 enable a number of different inputs to be applied to the comparator inputs 2202. The comparator input sources via the multiplexers 2204 and 2206 include 23 general purpose input/output (GPIO) pads 2302, a ground input 2304, a Vbat input 2306 (supply voltage in one cell mode), a VDD input 2308 (output of DC to DC boost converter 158 and supply voltage in two cell mode), a VDD/2 input 2310 and a Vreg input (supplied by internal 1.7 volt regulated supply) 2312. Each of these different voltage levels may be applied as a reference voltage to the input of a comparator 2202 for comparison to another voltage supplied on one of the GPIO pins 2302. The multiplexers 2204 and 2206 additionally support capacitive touch switches through inputs 2320. When the capacitor switch compare input 2320 is selected by the SFR register 2212, any I/O pin 2302 connected to the other multiplexer can be directly connected to a capacitive touch switch with no additional external components. The cap switch compare input provides the appropriate reference level for detecting when the capacitive touch switches connected to the I/O pins 2302 have charged or discharged through the on-chip $R_{sense}$ resistor.

In operation with respect to capacitive touch sensing, one of multiplexer 2204 or 2206 is configured to select the analog inputs on the associated GPIO ports 2302. The other of the two multiplexers 2204 or 2206 is configured to select the reference voltage input. When this is selected, a voltage is selected with two resistors, resistors 2330 and 2332 on an input 2336 associated with the input multiplexer 2206. A similar structure is associated with multiplexer 2204 and the input 2320. This input 2235 is substantially the same as input 2320. The resistors are only connected in series to VDD/DC+ when the comparator is enabled. Typically, these resistors are formed of diode connected resistors or they could be fabricated from poly resistor. However, they are gated to the power supply only when this function is enabled such that they do not draw current unless the function is enabled. In addition, there is provided a resistor 2334 that is connected to either charge or discharge of the node 2320, depending upon the CPnOUT bit. This bit is determined by the control register 2212. If the output is in one logic state, the resistor 2334 is connected to the positive supply and if it is in the opposite logic state, it is connected to ground to either charge or discharge node 2320. Similarly, there is also provided a sense resistor 2336 that is connected between the output of each of the analog multiplexers 2204 and 2206. This is a gated resistor that is connected to ground or to VDD/DC+. This is enabled only on the one of the analog multiplexers 2204 or 2206 that is connected to the analog input ports 2302. The three resistor structure associated with node 2320 allows the voltage to be varied as a function of the output of the comparator such that, as indicated by the notation in the drawing, the voltage will be ⅓ or ⅔ of VDD/DC+. Therefore, when it is charging it will be one voltage and when it is discharging it will be a second voltage. This basically can change the reference as a function of the output. The second input structure on the nodes 2310 for each of the multiplexers 2204 provides a reference voltage that is not controlled by a similar resistor 2334 such that it provides a constant voltage of ½ of VDD/DC+.

In operation, the resistor 2336 associated with one of the analog multiplexers 2204 or 2206 is connected to the GPIO ports 2302, each of which is connected to one of a capacitor sensor that will be connected to VDD/DC+ or ground. Initially, when the capacitor is discharged, the input will be a low voltage that, if connected to the negative input via multiplexer 2206, will result in the negative input of multiplexer 2202 being lower than the voltage on node 2320, for example. This will cause the output of comparator 2202 to be a logic high, charging the capacitor. When the voltage on the capacitor passes the threshold, which should be ⅔ of the supply voltage, the comparator 2202 will switch and cause the sense resistor 2336 to be connected to ground, beginning a discharge cycle. This will basically form a relaxation oscillator with a reference voltage having programmable hysteresis. The programmable hysteresis being the value of the resistor and the programming aspect being hysteresis or no hysteresis. It can be seen that no external components are required other than the capacitor sensors themselves. Further, the multiplexer 2206 can be operated to scan each of the outputs and determine the frequency thereof, depending upon the response time and the frequency of the relaxation oscillator. This, of course, is determined by the value of the capacitor touch sensors and the resistors 2330, 2332 and 2336.

In order to measure the frequency, the output of the comparator 2202 is input to the timer which determines the amount of time that the output of the comparator is high and the amount of time that the output of the comparator is low. If the capacitance value changes, i.e., someone touches the sensor, then the frequency will change. This is noted in the processing portion thereof which is facilitated with the MCU core processor, and a threshold value can be set.

The configuration information for this channel select register 2212 CPT0MX is set forth in the following table:

SFR Definition 5.5. CPT0MX: Comparator0 Input Channel Select

| | Bit | | | | | | | |
|---|---|---|---|---|---|---|---|---|
| | 7 | 6 | 5 | 4 | 3 | 2 | 1 | 0 |
| Name | | CMX0N | | | | CMX0P | | |
| Type | R/W | R/W | R/W | R/W | R/W | R/W | R/W | R/W |
| Reset | 1 | 1 | 1 | 1 | 1 | 1 | 1 | 1 |

SFRPAGE = 0x0; SFR Address = 0x9F

| Bit | Name | Function |
|---|---|---|
| [7:4] | CMX0N | Comparator0 Negative Input Selection. Selects the negative input channel for Comparator0.<br>0000: P0.1    1000: P2.1 (C8051F920/30 Only)<br>0001: P0.3    1001: P2.3 (C8051F920/30 Only)<br>0010: P0.5    1010: P2.5 (C8051F920/30 Only)<br>0011: P0.7    1011: Reserved<br>0100: P1.1    1100: CapSwitch Compare<br>0101: P1.3    1101: VDD/DC+ divided by 2<br>0110: P1.5    1110: Digital Supply Voltage<br>0111: P1.7 (C8051F920/30 Only)    1111: Ground |

| -continued | | | | |
|---|---|---|---|---|
| [3:0] CMX0P | Comparator0 Positive Input Selection. Selects the positive input channel for Comparator0. | | | |
| | 0000: | P0.0 | 1000: | P2.0 (C8051F920/30 Only) |
| | 0001: | P0.2 | 1001: | P2.2 (C8051F920/30 Only) |
| | 0010: | P0.4 | 1010: | P2.4 (C8051F920/30 Only) |
| | 0011: | P0.6 | 1011: | P2.6 (C8051F920/30 Only) |
| | 0100: | P1.0 | 1100: | CapSwitch Compare |
| | 0101: | P1.2 | 1101: | VDD/DC+ divided by 2 |
| | 0110: | P1.4 | 1110: | VBAT Supply Voltage |
| | 0111: | P1.6 | 1111: | VDD/DC+ Supply Voltage |

Figure 24:
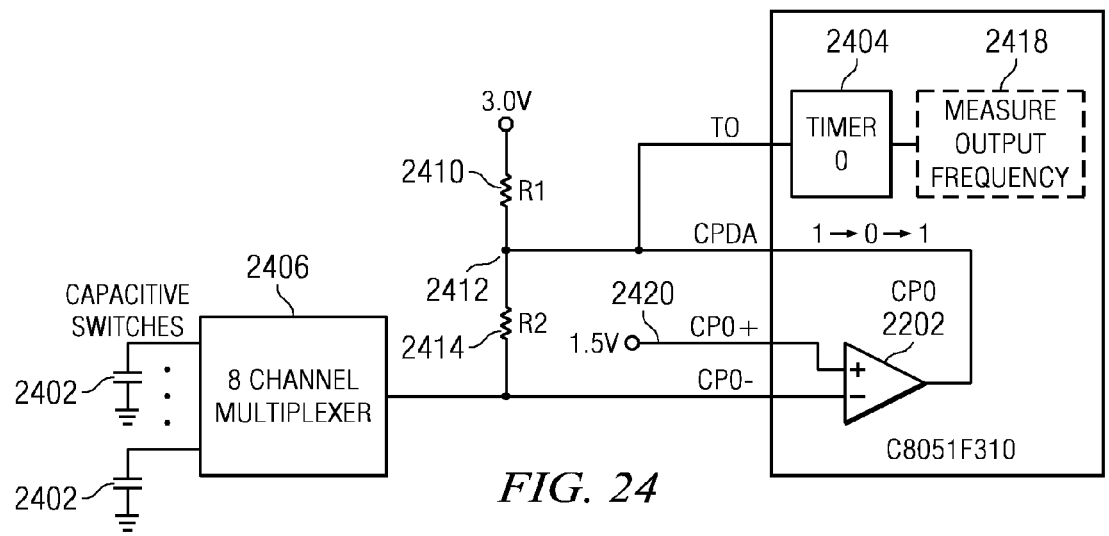
FIG. 24 illustrates a first embodiment of the capacitive switching configuration enabled through the comparator of FIG. 21.

Referring now to FIG. 24, there is illustrated the manner in which the capacitive (contactless) switch configuration may be enabled through the comparator 2202 using external multiplexers and components. In this case, a cap switch compare input 2426 has been selected for the positive input of the comparator 2202 to be connected to a reference voltage comprised of a three resistor network, as illustrated in FIG. 23. A group of capacitive switches 2402 are connected through an external analog multiplexer 2406 to the negative input of the comparator 2202. A capacitive switch array 2402 enables various capacitances to be applied to the comparator input 2202. Capacitive switches typically have a background capacitance of 10 to 20 Pico farads between the sensor and ground. A finger touch near the capacitive sensor 2402 will increase the capacitance by perhaps 1 to 2 Pico farads, depending on the design of the sensor and the thickness and dielectric properties of the overlying material. This design configures the comparator 2202 as an RC based oscillator in which the capacitive switch forms the C portion (a three resistor network attached to CP0+ is not shown). Timers 2404 are used to measure the oscillation frequency. The calibration step records the baseline frequencies associated with each input. When a finger activates a switch 2402, the oscillation frequency will drop. When the frequency drop exceeds a threshold a positive detection occurs. The capacitive switches may be implemented with no external components using only one GPIO pad 2302 per switch.

This particular configuration requires the external pins to be utilized with respect to the comparator 2202. Instead of utilizing internal multiplexers, the select one of the pins is connected to an external multiplexer 2406. An external resistor 2410 is connected between an external voltage and a node 2412 with a second external resistor 2414 connected between node 2412 and the output of the multiplexer 2406. The output of multiplexer 2406 is connected to the negative input of the comparator 2202 with the positive input connected to reference voltage. The output of the comparator 2202 is connected through the crossbar switch to a dedicated output pin which is connected to node 2412. Additionally, this node 2412 is connected to another input or GPIO port which is connected through the crossbar switch to one of the timers, the timer 2404. This timer, as disclosed herein above, basically measures the time between a logic 0 and a logic 1 and then back to logic 0. This allows a calculation of the output frequency, as indicated by a block 2418. This provides the advantage in that the output frequency first-order insensitive to 50/60 Hz pickup from the AC mains. It is also insensitive to supply voltage without requiring a precision reference, as it has an external reference. The disadvantages, of course, is that it requires an external multiplexer and several external resistors and it also requires the use of four package pins in addition to the ones that control the mux (not shown). In operation, it is very similar to the disclosure of FIG. 23 in that the multiplexer is scanned to determine the frequency of oscillation of each of the capacitors at any given point in time. If they are touched, the frequency will decrease since the capacitor has increased. By comparing this to a frequency threshold, the MCU can determine whether the capacitor sensor has been touched or not.

Figure 25:
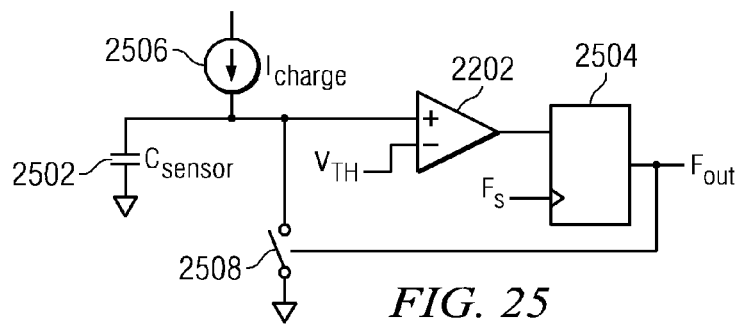
FIG. 25 illustrates a second embodiment for attaching capacitive sensors with the comparator of FIG. 21.

Referring now to FIG. 25, there is illustrated an alternative configuration for attaching a capacitive sensor 2502 to the comparator 2202. The output of the comparator 2202 is applied to a latch circuit 2504. The output of the frequency $F_{out}$ is inversely proportional to the value of the capacitor sensor $C_{sensor}$. Typical values for $C_{sensor}$ are 10 pico farads to 30 pico farads. A finger touch near the sensor will increase the capacitance by 1 to 2 pico farads. The value $F_s$ is a sampling clock signal applied to the latch 2504 and a current source $I_{charge}$ 2506 must be applied to the positive input of the comparator 2202. A discharge switch 2508 is used to discharge the capacitive sensor 2502. Additional configurations may use bipolar sensing techniques to detect the capacitive switching array sensors attached to the input of the comparator 2202. Other types of capacitive switching sensor arrays may also be utilized.

In operation, the sampling frequency samples the output of the comparator 2202. If it is a logic 1, the output will cause the switch 2508 to close and discharge the top plate of the capacitor at the sampling frequency rate.

VDD Detectors

Figure 26:
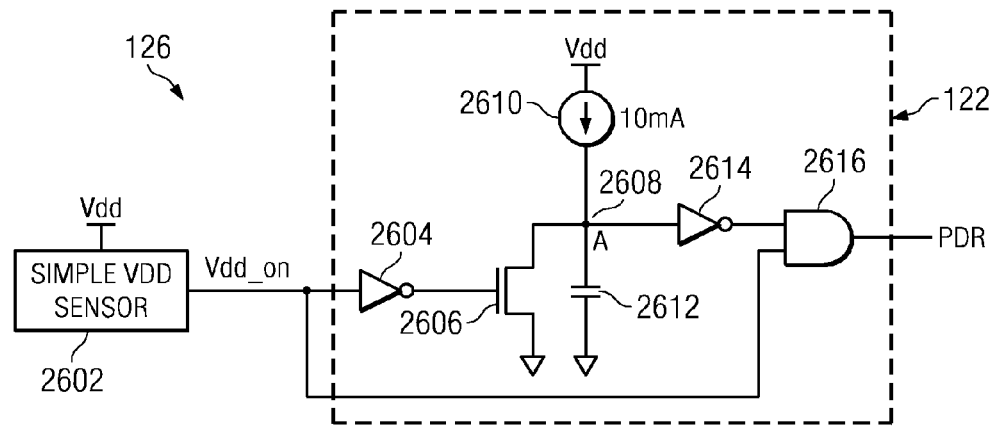
FIG. 26 is a schematic block diagram of the brownout detector.

Referring now to FIG. 26, there is illustrated the circuitry of the brownout detector 126 for generating the power on reset signal described previously with respect to FIG. 1. The brownout circuitry 126 is used for generating a power on reset (POR) signal while the system voltage VDD is ramping up (Note that VDD is the supply voltage Vbat for the VDD detector). The brownout detector 126 insures that the power management unit 124 has enough voltage to operate. The PMU 124 requires at least 0.8 volts for proper operation and the brownout detector 126 maintains the PMU 124 in reset mode until the desired voltage is achieved. The brownout detector 126 includes a VDD sensor 2602. The VDD sensor 2602 is a simple sensor having an output providing the signal VDD_on that goes high when VDD reaches a selected threshold voltage. The output of the VDD sensor 2602 VDD_on goes low when VDD falls below the threshold level. The threshold can be in a wide range of voltages form 0.4 volts to 0.87 volts depending on the process variations and temperatures of operation of the MCU.

The output of the VDD sensor 2602 is connected to the input of an inverter 2604 within the power on reset circuit 122. The output of the inverter 2604 is connected to the gate of a transistor 2606. The drain/source path of transistor 2606 is connected between node 2608 and ground. A current source 2610 is connected between VDD and node 2608. A capacitor 2612 is connected between node 2608 and ground. An input of an inverter 2614 is connected to node 2608 and the output of the inverter 2614 is connected to a first input of AND gate 2616. The second input of AND gate 2616 is connected to the output of the simple VDD sensor 2602. The AND gate 2616 provides the output for power on reset. When VDD is ramped up higher than the threshold value established by the VDD sensor 2602, the power on reset circuit 122 is enabled. Node 2608 is charged up when transistor 2606 is turned off responsive to VDD_on going high causing the power on reset signal to go low generating a falling edge. No matter how slowly VDD ramps up, a power on reset signal from AND gate 2616 may be generated.

Figure 27:
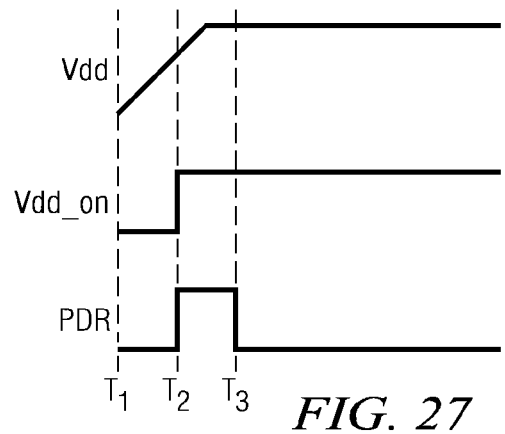
FIG. 27 is a timing diagram illustrating the operation of the brownout detector of FIG. 26.

Referring now to FIG. 27, there is illustrated a timing diagram of the generation of the power on reset signal from AND gate 2616. As VDD begins ramping up at time $T_1$, VDD_on remains low until VDD ramps up to the threshold value established within the VDD sensor 2602. When VDD reaches this threshold value at time $T_2$, the output of the VDD sensor VDD_on goes high which also drives the output of the power on reset (POR) 122 high at time $T_2$. VDD continues to ramp up to its maximum voltage level. When VDD_on goes high, this causes node 2608 to begin charging. Once the node 2608 is fully charged at time $T_3$, the output of the power on reset 122 goes low at time $T_3$. Thus, the power on reset signal will remain high throughout the time that VDD is ramping up to its full voltage level. It is noted that the length of time between $T_2$ and $T_3$ is a function of the current supply by the current source 2610. Of course, this current source is affected by the battery voltage at the VDD terminal 2610. This can vary. If the Vbat voltage decreases slightly, then the POR will remain high until there is sufficient voltage and current to charge the node 2608 to a high voltage. As such, this prevents the PMU from operating until the POR goes low at time $T_3$.

Figure 28:
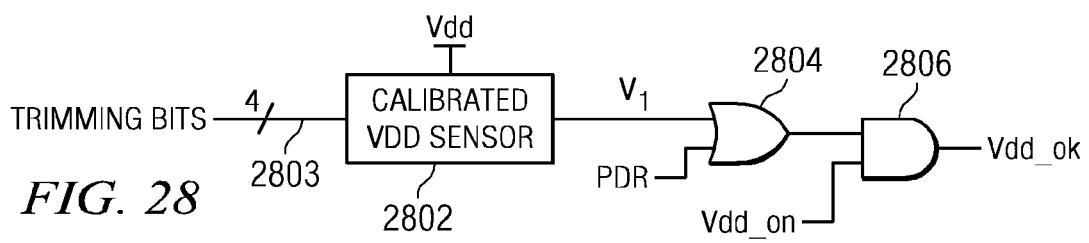
FIG. 28 is a schematic block diagram of a 0.8 volt VDD monitoring circuit for generating an alarm signal when VDD falls below 0.8 volts.

Referring now to FIG. 28, there is illustrated the remainder of the 0.8 volt VDD monitoring (brown out) circuitry that generates an alarm signal when the system voltage VDD falls below 0.8 volts. The circuitry includes a calibrated VDD sensor 2802 connected to receive the system voltage VDD and the trimming bits from the MCU controller over a four-bit bus 2803 that set the detection threshold level of 0.8V. The calibrated VDD sensor 2802 determines if the system voltage VDD exceeds 0.8V and generates a control signal responsive thereto. The output of the calibrated VDD sensor is a control signal at a voltage $V_1$ which is connected to a first input of an OR gate 2804. The second input of the OR gate 2804 comes from the POR signal of the power on reset circuit illustrated in FIG. 27. The output of the OR gate 2804 is connected to a first input of AND gate 2806. The second input of AND gate 2806 comprises the VDD_on signal from the simple VDD sensor 2602 of FIG. 26. The output of the AND gate 2806 is the VDD_ok signal. When VDD ramps up, the power on reset signal rising edge follows the VDD_on signal rising edge as illustrated previously in FIG. 27. After the power on reset signal goes low, $V_1$ is already high and VDD_ok equals VDD_on. After the MCU is turned on, the trimming bits are set to a calibrated value and the VDD sensor threshold of sensor 2802 is set to 0.8 volts to 0.9 volts which is a much more accurate range. When VDD falls below the threshold, $V_1$ equals 0 and VDD_ok falls to 0 generating an alarm condition to the PMU 124.

In operation, the calibrated VDD sensor is essentially a VDD sensor that includes an in-channel transistor connected between the $V_1$ output and ground and has the gate thereof connected to a bias circuitry, the bias circuitry connected to the VDD input (which comprises the Vbat voltage). A series of diode-connected P-channel transistors are connected between the VDD input and the node $V_1$. As the voltage ramps up, the current through the load increases, pulling the $V_1$ node high, by overcoming the bias current and the in channel transistor. For example, if the bias current in the in channel transistor were set to approximately 20 nA, the diode-connected P-channel transistor load could be set such that a value of approximately 20 nA resulted in the voltage $V_1$ exceeding the trigger point on the input of the OR gate 2804 at a voltage of 0.871 volts on VDD. By changing the number of diode-connected P-channel transistors in the stream, this voltage can be changed. This is affected by shorting the diode-connected string at select points therealong with other diode-connected P-channel transistor and pulling the gates thereof low with the trimming bits on the input 2803. This is facilitated with the use of some type of decoder.

In a calibration operation, what would occur is that VDD would be set to a fixed voltage of 0.8 volts, for example. The trimming bits would then be varied to determine when $V_1$ triggered the input of the OR gate. This would be facilitated by isolating the output of the OR gate from the input of the AND gate 2806 and then monitoring that input in one of the SFR registers. Thus, a very exact threshold can be set. The reason for this is that the simple sensor 2602 is not calibrated and could range from 0.6 volts to 0.9 volts. If this voltage were too high, then the AND gate 2806 would turn off when the voltage fell below 0.9 volts or it could turn off when it fell below 0.6 volts, this being too late. What is important is that there be calibrated voltage (after power on reset and the power management unit has finished its operation, such that the system is aware that the Vbat voltage has fallen below 0.8 volts with a higher degree of confidence than would be present if the system relied primarily on the td_on.

Figure 29:
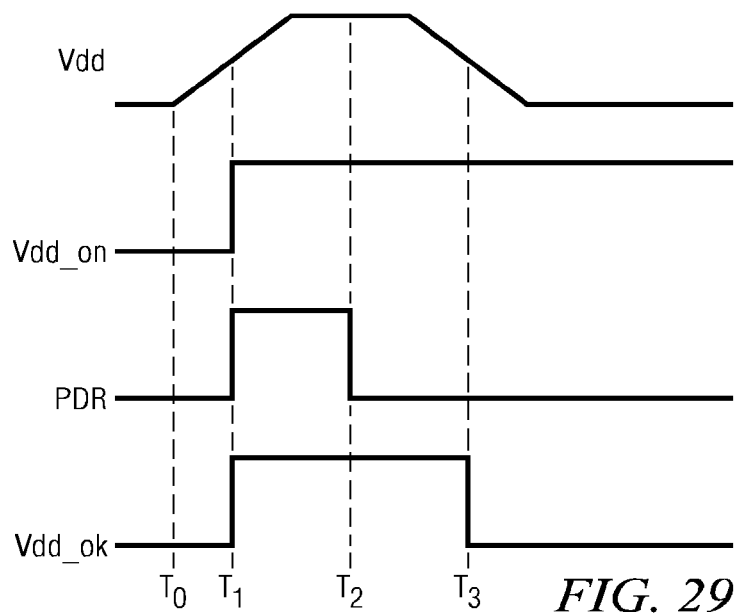
FIG. 29 is a timing diagram of the circuit of FIG. 28.

Referring now to FIG. 29, there is illustrated a timing diagram associated with the circuitry of FIG. 28. The system voltage VDD begins to ramp up at time $T_0$. As described previously with respect to FIG. 27, when a threshold voltage established within VDD sensor 2602 reaches its threshold value, both the signal VDD_on from the sensor 2602 and the power on reset signal from the reset circuit 122 both go high at time $T_1$. Once VDD rises to a sufficient level and charges the node 2608 of the power on reset circuit 122, the power on reset signal will go low at time $T_2$. At the time $T_1$ when the power on reset signal and VDD_on signal go high, the VDD_ok signal will also go high at time $T_1$. This signal will remain at a logical high value until the system voltage VDD drops below a desired threshold voltage at time $T_3$. When this occurs, the VDD_ok signal goes low generating the alarm condition. However, if $V_1$ is calibrated to a more accurate value, then $V_1$ may go low before VDD_on and control the operational $T_3$.

Figure 30:
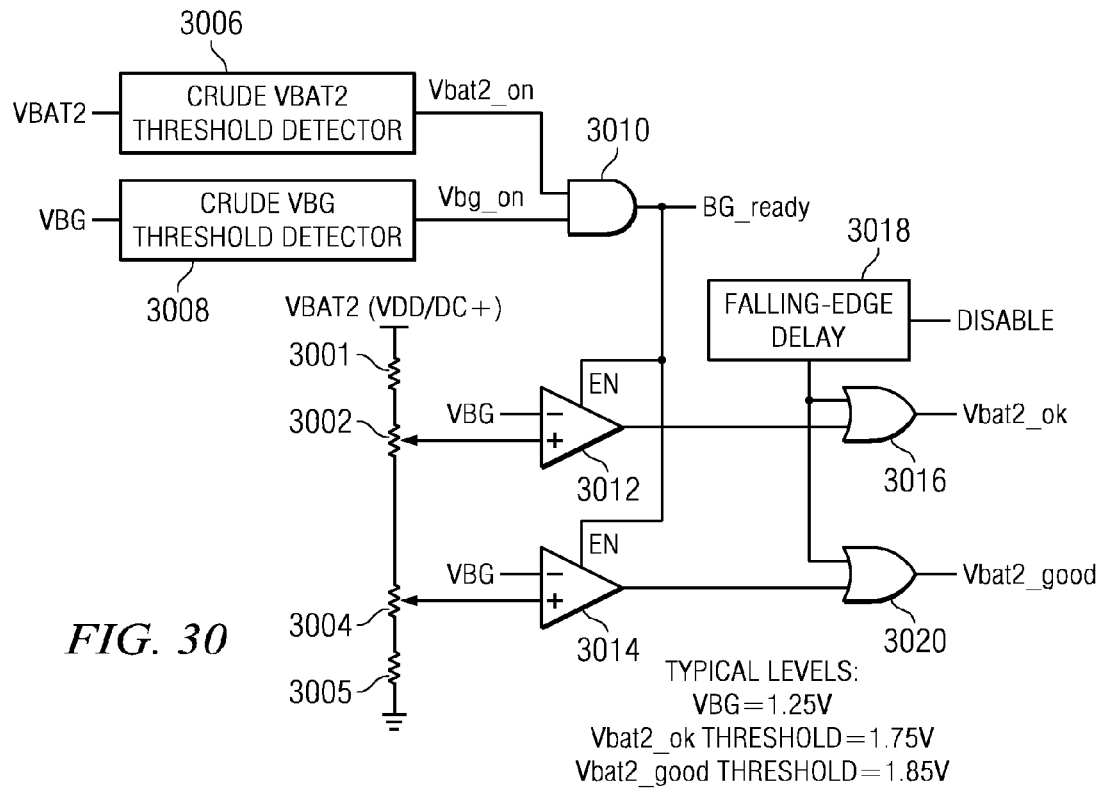
FIG. 30 is a functional block diagram of a 1.8 volt VDD monitor circuit.

Referring now to FIG. 30, there is illustrated a functional block diagram of the 1.8 volt VDD monitor. The main purpose of the 1.8 volt VDD monitor is to provide an indication (Vbat2_ok signal) when the VDD/DC+ voltage (referred to as Vbat2) is above the minimum value of 1.8 volts. The VDD/DC+ voltage comprises the output of the DC to DC boost converter in a one cell mode of operation and the input to the voltage regulators in all other modes of operation. The Vbat2_ok signal insures that the digital regulator has sufficient supply voltage to provide minimum required voltage levels of 1.62 volts to the core logic, SRAM and flash memory blocks. The optimal threshold voltage is between 1.7 volts and 1.8 volts. A threshold higher than 1.8 volts will cause the MCU to be disabled, even though the supply voltage is above the minimum spec value, while a threshold lower than 1.7 volts may not insure that the digital regulator can maintain a 1.62 volt output. The target nominal threshold is thus approximately 1.75 volts. Three trim bits are applied to variable resistors 3002 and 3004 for adjusting the threshold over a total range of about 100 mV. The Vbat2_ok signal can be enabled or disabled as a reset source to the MCU. Variable resistors 3002 and 3004 are comprised of three-terminal digitally-controlled potentiometers. A 3-bit digital value determines the position of the tap terminal along the resistor body. At the maximum digital value, the tap terminal is connected to the top end of the resistor, while at the minimum digital value the tap terminal is connected to the bottom end of the resistor.

An additional feature provided by the 1.8 volt VDD monitor circuit is a second output (Vbat2_good) with a slightly higher threshold than Vbat2_ok. The Vbat2_good output cannot be configured as a reset source, but it can be used as an interrupt that will give a warning that the battery voltage is approaching its minimum value. This enables a user application to go through a defined power down sequence without needing to periodically measure the supply voltage with the ADC converter 154. The Vbat2_good threshold is trimmed using three bits provided to a variable resistor 3004. The target nominal threshold for the Vbat2_good signal is 1.85 volts.

Referring now more particularly to FIG. 30, the voltage signal VDD/DC+ from the boost converter is provided to a crude threshold detector circuit 3006 (uncalibrated threshold voltages). The crude threshold detector circuit 3006 detects the VDD/DC+ voltage level. The band gap voltage (VBG) is applied to a crude band gap voltage detector 3008 that detects the band gap voltage. Each of the outputs of the VDD/DC+ threshold detector and the band gap voltage detector are applied to inputs of an AND gate 3010. When the VDD/DC+ threshold detector 3006 and the band gap voltage threshold detector 3008 each provide an indication that the associated voltages have reached the desired level, the AND gate 3010 will provide a logical high value for the band gap ready signal (BG_ready). This signal is applied as an enable signal to a pair of comparator circuits 3012 and 3014. Since the band gap voltage (VBG) is very accurate under steady state conditions, the Vbat2_ok signal and the Vbat2_good signal thresholds will be based on a very precise reference voltage. However, there are start up problems with a comparator circuit of this type. If VDD/DC+ ramps quicker than VBG (which often occurs at initial power up) the comparator outputs will go high even if VDD/DC+ is much lower than the desired threshold. In the extreme case, if VBG equals 0 volts, the comparator outputs will go high anytime Vbat is greater than 0 volts. Therefore, it is necessary to add some auxiliary circuitry to insure that the comparators are only enabled when the input voltages have settled. As shown in FIG. 30, crude absolute level threshold detectors 3006 and 3008 are logically ANDed together to form the BG_ready signal. These detectors 3006 and 3008 are uncalibrated because they operate before the CPU starts up and loads the calibration bits from the flash memory into the calibration registers. These threshold detector circuits are very fast and draw little current which precludes high accuracies. However, high accuracy is not required because the detectors serve only to keep the comparators 3012 and 3014 disabled until the band gap voltage is stabilized at the initial start up.

Comparator 3012 compares the band gap voltage (VBG) applied to its negative input to a threshold voltage value applied to the positive input thereof. The threshold voltage value may be adjusted using a variable resistor 3002 that is controlled via a 3 bit threshold adjustment of trim bits as described previously. The comparator 3014 has the band gap voltage (VBG) applied to its negative input and its positive input connected to receive a reference from variable resistor 3004. Variable resistor 3004 is also adjustable via a 3 bit trim input. The output of comparator 3012 is applied to a first input of an OR gate 3016. The other input of OR gate 3016 is provided by a falling edge delay circuit 3018 which is connected to receive an input disable signal. The falling edge delay block 3018 shown in FIG. 30 solves an additional start up problem. The OR gates 3016 and 3020 on the outputs of the comparators 3012 and 3014 are designed to force the outputs high when the block is disabled by the CPU. The reason for this is that it is assumed that if a user code is disabling the VDD monitor, the user is taking responsibility to insure that the supply voltage is adequate so the outputs are forced high. However, if the disable signal is fed directly into the OR gates, then there is a glitch when the CPU enables the block (by deasserting the disable input) because the comparators take some time to power up and make a valid comparison. The purpose of the delay is to hold the outputs high until the comparators can settle.

The output of OR gate 3016 comprises the Vbat2_ok signal. The output of comparator 3014 is connected to a first input of OR gate 3020. The other output of OR gate 3020 is also connected to the output of falling edge delay circuit 3018. The output of OR gate 3020 comprises the Vbat2_good signal. The threshold voltages applied to the positive inputs of each of comparators 3012 and 3014 are from a resistor ladder consisting of a series connection of resistors 3001, variable resistor 3002, variable resistor 3004 and resistor 3005 connected between VDD/DC+ and ground.

Figure 31A:
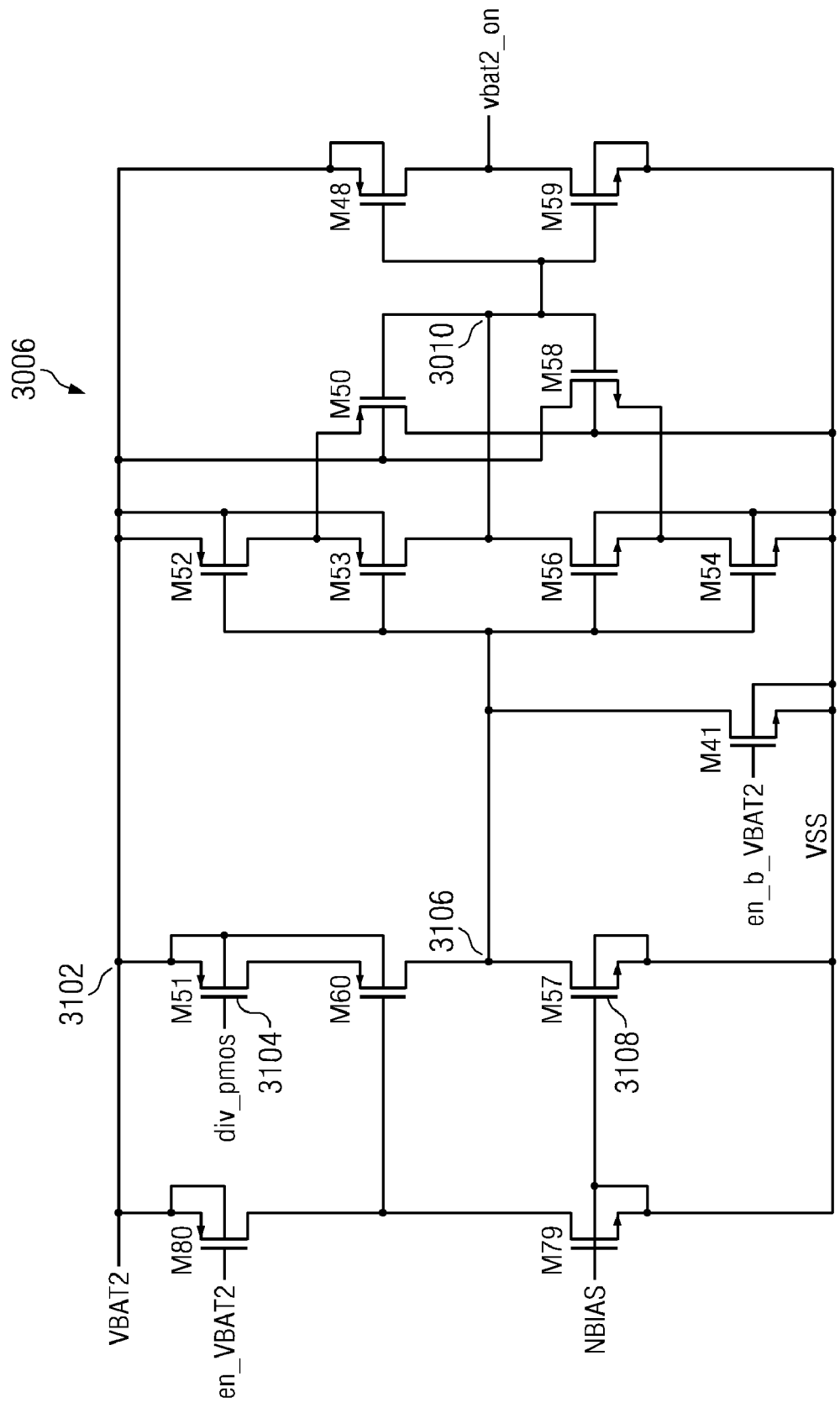
FIGS. 31a and 31b are detailed schematic diagrams of the circuit of FIG. 30.
Figure 31B:
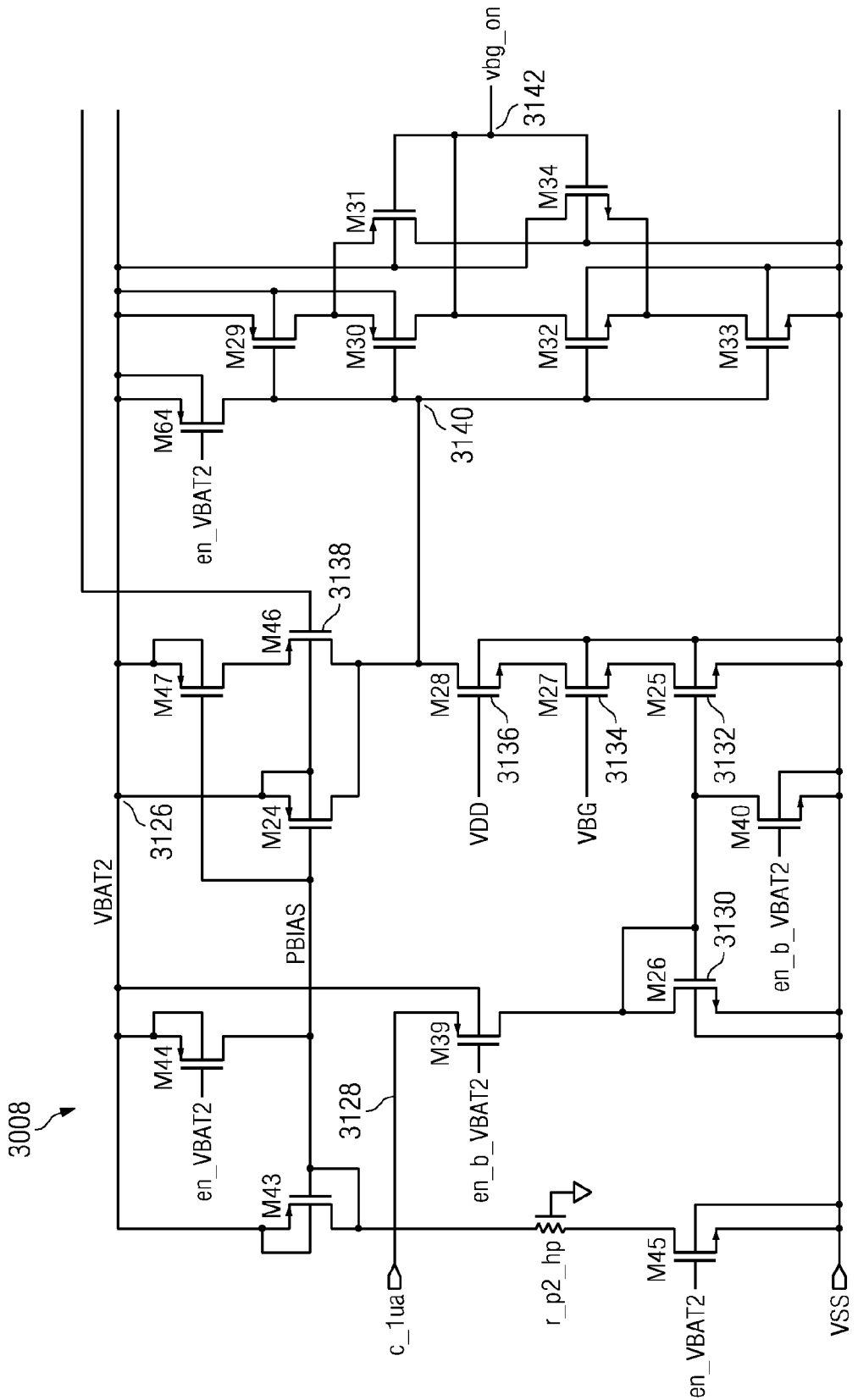

Referring now to FIGS. 31a and 31b, there are illustrated schematics of the Vbat2 threshold detector 3006 and the Vbg threshold detector 3008. With specific reference to FIG. 31a, the Vbat2 threshold detector is a detector where the output vbat2_on goes high when the voltage Vbat2 on a power supply terminal 3102 goes above 1.5v (1.2v-1.75v over processing temperature). It utilizes a current comparator in which a P-channel transistor 3104 connected between node 3102 and a node 3106 sources a current to node 3106 that rises exponentially with Vbat2 above a threshold voltage. An N-channel transistor 3108 has a source/drain path thereof connected between node 3106 and ground and the gate thereof connected to a bias voltage and has a current that rises linearly with Vbat2. The transistor 3104 is sized such that the detection threshold is relatively flat over temperature. The node 3106 drives an inverter comprised of plurality of P-channel and N-channel transistors to provide an output on a node 3110 which drives a second inverter that provides the output Vbat2_on.

Referring now to FIG. 31b, a description of the VBG threshold detector 3008 will be provided. The output of vbg_on goes high when vbg is higher than 1.0v (approximately 0.75v to 1.15v or processing temperature). The voltage Vbat2 is connected to the power supply terminal 3126 and provides power to the circuit. A 1 microamp current is connected to the drain of the diode-connected N-channel transistor 3130. This is mirrored over to an N-channel transistor 3132 in a string of N-channel transistors, the N-channel transistor 3132 having the source thereof connected to ground. This mirrored current is driven through a chain of an N-channel transistor 3134 with a gate thereof connected to VBG and an N-channel transistor 3136 with a gate thereof connected to VDD. A P-channel transistor 3138 is connected series thereto and is enabled when vbat2_on is low. When high, it is disabled. When VBG on the gate of transistor 3134 is higher than 1.0 volts, and VDD on the gate of transistor 3136 is higher than approximately 0.9 volts, node 3140 will be pulled low on the input of an inverter, raising the output, vbg_on high on an output node 3142. The current on node 3128 is the band gap current and this must be at least a few hundred nA.

Band Gap Generator

Figure 32:
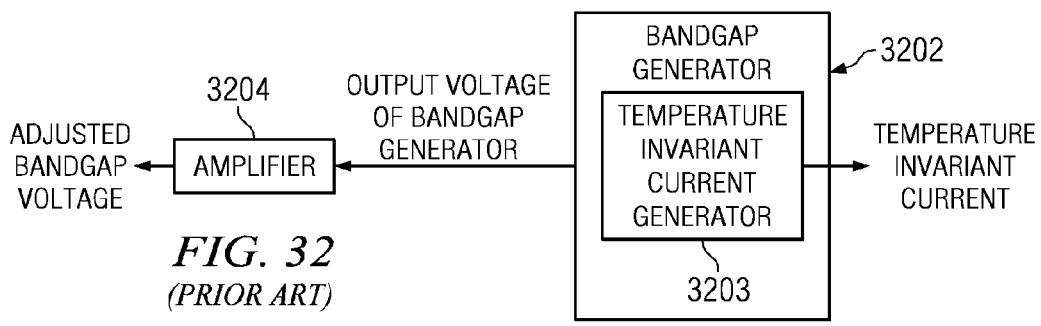
FIG. 32 illustrates a prior art embodiment of the manner for controlling the output voltage of a band gap generator.

Referring now to FIG. 32, there is illustrated a prior art embodiment of the manner in which the output of the band gap generator output voltage is adjusted. Previously, when the output voltage of the band gap generator 3202 was to be adjusted, this could not be done internally within the band gap generator 3202 because the temperature characteristics of the band gap current would be adversely affected by altering the output voltage within the band gap generator 3202. The temperature invariant current of the temperature invariant current generator 3203 would be adversely affected. In order to provide an adjusted band gap voltage without altering the temperature characteristics of the band gap generator 3202, an amplifier circuit 3204 was placed on the output of the band gap generator 3202. The amplifier 3204 was used to adjust the band gap voltage external to the band gap generator 3202. This provides an independent manner for controlling the band gap voltage without affecting the temperature characteristics of the band gap generator 3202. While this configuration is useful, it requires rather high current in order to operate. The amount of current drawn by the amplifier 3204 can be a problem in low power operations wherein it is desired to use as little power as possible in order to maintain a battery charge for an extended period of time.

Figure 33:
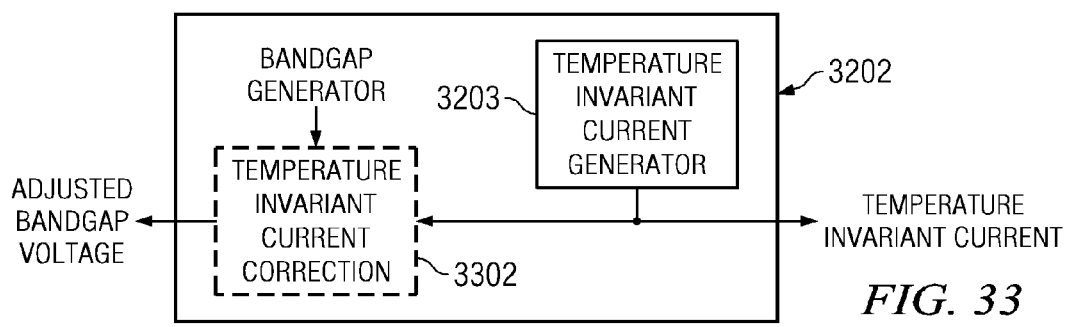
FIG. 33 illustrates the embodiment of the present invention for controlling the output voltage of the band gap generator.

Thus, as illustrated in FIG. 33, an improved method for controlling the band gap generator output voltage utilizes temperature invariant current, which is one of the outputs of band gap generator 3202 from the temperature invariant current generator 3203, to build a correction circuit 3302 which is incorporated within the band gap generator circuitry 3202. The temperature invariant current correction circuit 3302 incorporated within the band gap generator 3202 utilizes approximately 2 microamps of current in its operation. This is significantly less than the approximately 50 microamps of current utilized by the amplifier 3204 configuration described with respect to FIG. 32. This provides a factor of 25% savings with respect to the necessary operating current for the band gap generator circuitry.

Figure 34:
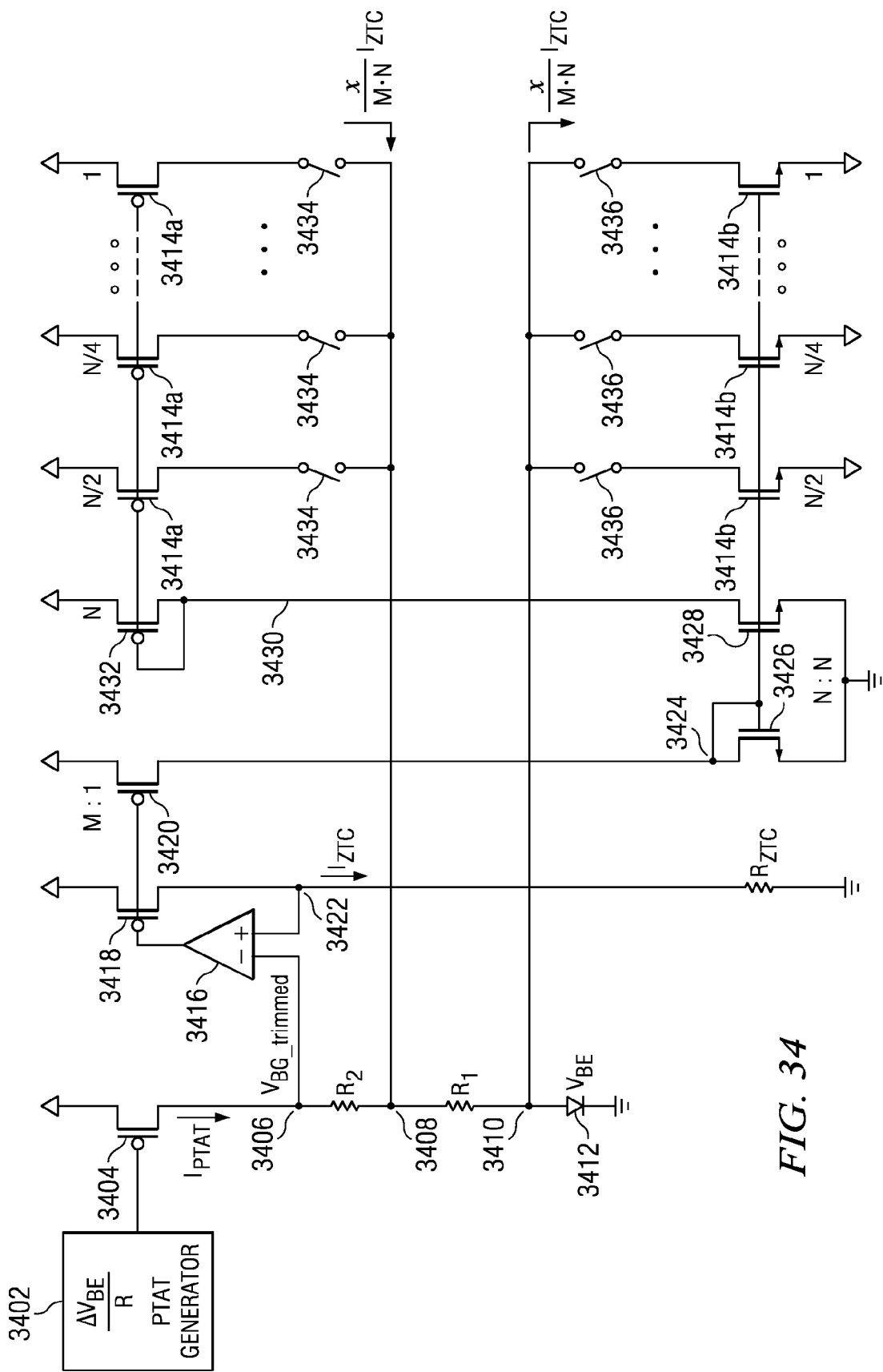
FIG. 34 is a schematic block diagram of the manner for controlling the output voltage of a band gap generator.

Referring now to FIG. 34, there is more particularly illustrated a schematic diagram of the band gap generator 3202 including the temperature invariant current correction circuit 3302 of the present disclosure. The band gap core circuitry consists of the $\Delta V_{BE}/R$ PTAT (proportional to absolute temperature) current generator block 3402. A PMOS transistor 3404 has its drain/source path connected between system power and node 3406. The gate of transistor 3404 is connected to receive the generated voltage from the $\Delta V_{BE}/R$ PTAT current generator 3402. Node 3406 is referred to as the $V_{BG\_trimmed}$ node which may have the voltage thereto trimmed responsive to varying currents applied through a resistor $R_1$. Node 3406 is connected to a first side of resistor $R_2$. The second side of resistor $R_2$ is connected to node 3408. Resistor $R_1$ is connected between node 3408 and node 3410. The diode 3412 has its anode connected to node 3410 and its cathode connected to ground. The band gap voltage of the band gap circuit is provided from node 3406. As mentioned previously, this voltage may be trimmed by adjusting the current that is applied through the resistor $R_1$. The current adjusted through resistor $R_1$ is controlled by turning on or off a number of transistors 3414 connected thereto. Node 3406 is connected to a negative input of operational amplifier 3416. The output of opamp 3416 is connected to the gates of P-channel transistors 3418 and 3420. The drain/source path of transistor 3418 is connected between system power and node 3422. Node 3422 is also connected to the positive input of operational amplifier 3416. A temperature invariant resistor $R_{ZTC}$ is connected between node 3422 and ground. This provides a voltage follower at node 3422. A temperature invariant current $I_{ZTC}$ is created by applying the bandgap voltage across $R_{ZTC}$. The current $I_{ZTC}$ is changed by controlling the amount of current and thus the voltage across resistor $R_1$. The opamp 3416 enables application of a small programmable voltage gain to the un-calibrated band gap voltage.

Transistor 3420 has its drain/source path connected between system power and node 3424. A current mirror consisting of transistor 3426 and 3428 have their gates connected to node 3424. The drain/source path of transistor 3426 is connected between node 3424 and ground. The drain/source path of transistor 3428 is connected between node 3430 and ground. Transistor 3432 has its drain/source path connected between system power and node 3430. The gate of transistor 3432 is also connected to node 3430.

A series of parallel transistors 3414a each have their gates connected to node 3430. The drain/source path of each of the transistors 3414a is connected between system power and a switch 3434 enabling the source of the transistor 3414a to be connected to node 3408 at the top of resistor $R_1$. Similarly, a series of transistors 3414b have their gates connected to node 3424. The drain/source path of each of transistors 3414b is connected between a switch 3436 and ground. The transistors 3414a and 3414b increase in size. By switching in individual ones of transistors 3414a, the amount of current injected into node 3408 may be increased or decreased. By switching in transistor 3414b the same amount of current injected into node 3408 is pulled from node 3410 to maintain current density of the diode constant. The current injected into node 3408 and pulled from node 3410 is a temperature invariant current that will vary the voltage across R1, without changing the PTAT current through R2 or diode 3412 and will thus allow adjustment of the output band gap voltage without changing the temperature characteristics of the band gap voltage generator. The following equations illustrate the operation of the circuit of FIG. 34:

$$V_{BG\_trimmed} = I_{PTAT} \cdot (R_2 + R_1) + V_{BE} + \frac{X}{M \cdot N} I_{ZTC} \cdot R_1$$

Assume X is the number corresponding to the present trimming setting $$\text{Maximum\_of\_x} = N - 1$$

Define $I_{PTAT} \cdot (R_2 + R_1) + V_{BE} \equiv V_{BG\_un\_trimmed}$ $$V_{BG\_trimmed} = V_{BG\_un\_trimmed} + \frac{X}{M \cdot N} I_{ZTC} \cdot R_1$$

$$= V_{BG\_un\_trimmed} + \frac{X}{M \cdot N} \cdot \frac{V_{BG\_trimmed}}{R_{ZTC}} \cdot R_1$$

$$\Rightarrow \boxed{\frac{V_{BG\_trimmed}}{V_{BG\_un\_trimmed}} = \frac{1}{\left(1 - \frac{R_1}{R_{ZTC}} \cdot \frac{X}{MN}\right)}} \boxed{\frac{R_1}{R_{ZTC}} \cdot \frac{X}{MN}}$$

is the positive feedback loop gain and must be less than 1.

Also, the loop gain will affect the system settling time.

$$V_{BG\_trimmed} = \frac{1}{1 - \frac{R_1}{R_{ZTC}}\left(\frac{\chi}{M \cdot N}\right)} \cdot V_{BG\_un\_trimmed}$$

$$\text{Define } \frac{R_1}{R_{ZTC}} \equiv K, K < 1$$

$$\therefore V_{BG\_trimmed} = \frac{1}{1 - K\left(\frac{\chi}{M \cdot N}\right)} \cdot V_{BG\_un\_trimmed}$$

$$\Delta V_{BG\_trimmed} \equiv V_{BG\_un\_trimmed}\left(\frac{1}{1 - K\frac{\chi+1}{MN}} - \frac{1}{1 - K\frac{\chi}{MN}}\right)$$

$$\frac{1}{1 - K\frac{\chi+1}{MN}} = \frac{MN}{K}\left[\frac{1}{\frac{MN - K\chi}{K} - 1}\right]$$

$$\because MN \gg 1, K < 1 \Rightarrow \frac{MN - K\chi}{K} \gg 1$$

$$\left(\frac{1}{A}\right)' = (A^{-1})' = -A^{-2} = \frac{-1}{A^2}$$

$$\Rightarrow \frac{1}{A - \Delta A} = \frac{1}{A} + \frac{1}{A^2}$$

$$\therefore \frac{MN}{K}\left[\frac{1}{\frac{MN - K\chi}{K} - 1}\right] = \frac{MN}{K}\left[\frac{1}{\frac{MN - K\chi}{K}} + \frac{1}{\left(\frac{MN - K\chi}{K}\right)^2}\right]$$

$$= \frac{MN}{MN - k\chi} + \frac{MNK}{(MN - K\chi)^2}$$

$$\therefore V_{BG\_trimmed} = V_{BG\_un\_trimmed}\left(\frac{MN}{MN - K\chi} + \frac{MNK}{(MN - K\chi)^2} - \frac{MN}{MN - K\chi}\right)$$

$$= V_{BG\_un\_trimmed} \cdot \frac{MNK}{(MN - K\chi)^2}$$

$$MN \gg K\chi$$

$$\boxed{\Rightarrow STEPSIZE = \Delta V_{BG\_trimmed} = \Delta V_{BG\_un\_trimmed} \cdot \frac{1}{M \cdot N} \cdot \frac{R_1}{R_{ZTC}}}$$

It will be appreciated by those skilled in the art having the benefit of this disclosure that this power supply system for low power MCU and its various components provides many advantages over existing MCU components. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A single chip microcontroller unit, comprising:
    a processing unit having a normal power mode of operation and a low power mode of operation;
    analog circuitry connected to the processing unit;
    digital circuitry connected to the processing unit;
    a power management unit controlling power operation of the processing unit, the analog circuitry and the digital circuitry; and
    a system voltage monitoring circuit for generating a system voltage control signal to maintain the power management unit in a reset mode responsive to a system voltage level with respect to a predetermined level during startup of the single chip microcontroller unit, wherein the system voltage monitoring circuit further comprises:
        first control circuitry for generating a power on reset signal to maintain the power management unit in a reset state responsive to a determination that the system voltage level does not exceed the predetermined level; and
        second control circuitry for generating an indication whether the system voltage level exceeds the predetermined level responsive to the power on reset signal, an uncalibrated voltage detection signal and a calibrated voltage detection signal.

2. The single chip microcontroller unit of claim 1, wherein the system voltage monitoring circuit further comprises:
    an uncalibrated system voltage detector for generating a first control signal responsive to the system voltage level with respect to the predetermined level;
    power on reset circuitry for generating a power on reset signal to maintain the power management unit in the reset state when the first control signal indicates the system voltage level does not exceed the predetermined level;
    a calibrated system voltage detector for generating a second control signal responsive to the system voltage level with respect to the predetermined level;
    control logic connected to receive the first control signal, the reset signal and the second control signal for generating an indication whether the system voltage level exceeds the predetermined level responsive to the first control signal, the reset signal and the second control signal.

3. The single chip microcontroller unit of claim 2, wherein the calibrated system voltage detector has the predetermined level calibrated responsive to a plurality of trim bits from the processing unit.

4. The single chip microcontroller unit of claim 2, wherein the control logic further comprises:
    a NOR gate connected to receive the second control signal from the calibrated system voltage detector at a first input of the NOR gate and the reset signal at a second input of the NOR gate; and
    an AND gate having a first input of the AND gate connected to an output of the NOR gate and a second input of the AND gate connected to receive the first control signal from the uncalibrated system voltage detector, the AND gate generating the indication of whether the system voltage lever exceeds the predetermined level on an output of the AND gate.

5. A single chip microcontroller unit, comprising:
    a processing unit having a normal power mode of operation and a low power mode of operation;
    analog circuitry connected to the processing unit;
    digital circuitry connected to the processing unit;
    a power management unit controlling power operation of the processing unit, the analog circuitry and the digital circuitry; and
    a system voltage monitoring circuit for generating a system voltage control signal to the power management unit responsive to a system voltage level with respect to a predetermined level, wherein the system voltage monitoring circuit further comprises:
an uncalibrated system voltage detector for generating a first control signal responsive to the system voltage level with respect to the predetermined level;
power on reset circuitry for generating a power on reset signal to maintain the single chip microcontroller unit in a reset state when the first control signal indicates the system voltage level does not exceed the predetermined level;
a calibrated system voltage detector for generating a second control signal responsive to the system voltage level with respect to the predetermined level; and
control logic connected to receive the first control signal, the reset signal and the second control signal for generating an indication whether the system voltage level exceeds the predetermined level responsive to the first control signal, the reset signal and the second control signal.

6. The single chip microcontroller unit of claim 5, wherein the calibrated system voltage detector has the predetermined level calibrated responsive to a plurality of trim bits from the processing unit.

7. The single chip microcontroller unit of claim 5, wherein the control logic further comprises:
a NOR gate connected to receive the second control signal from the calibrated system voltage detector at a first input of the NOR gate and the reset signal at a second input of the NOR gate; and
an AND gate having a first input of the AND gate connected to an output of the NOR gate and a second input of the AND gate connected to receive the first control signal from the uncalibrated system voltage detector, the AND gate generating the indication of whether the system voltage lever exceeds the predetermined level on an output of the AND gate.

8. A method for monitoring a system voltage during start-up, comprising the steps of:
powering up a single chip microcontroller unit;
performing an uncalibrated measurement of the system voltage level with respect to a predetermined level;
generating a first control signal responsive to the calibrated measurement;
generating a power on reset signal to maintain the single chip microcontroller unit in a reset state when the first control signal indicates the system voltage level does not exceed the predetermined level;
performing a calibrated measurement responsive to the system voltage level with respect to the predetermined level;
generating a second control signal responsive to the calibrated measurement; and
generating an indication whether the system voltage level exceeds the predetermined level responsive to the first control signal, the reset signal and the second control signal.

9. The method of claim 8, wherein the step of performing the calibrated measurement further comprises the step of calibrating a system voltage detector responsive to a plurality of trim bits from a control unit.

10. A single chip microcontroller unit, comprising:
a processing unit having a normal power mode of operation and a low power mode of operation;
analog circuitry connected to the processing unit;
digital circuitry connected to the processing unit;
a power management unit controlling power operation of the processing unit, the analog circuitry and the digital circuitry; and
a supply monitoring circuit for determining if a chip supply voltage level exceeds a threshold level, wherein the supply monitoring circuit further comprises:
a first comparator circuit for comparing a band gap voltage to a reference threshold voltage;
an enable circuit for disabling the first comparator circuit until the band gap voltage stabilizes at start up, wherein the enable circuit further comprises;
a voltage supply detector for determining when the supply voltage exceeds a voltage supply threshold and generating a first indication responsive thereto;
a band gap voltage detector for determining when the band gap voltage exceeds a band gap voltage threshold and generating a second indication responsive thereto; and
control logic for generating an enable signal responsive to the first indication and the second indication.

11. The single chip microcontroller unit of claim 10, wherein the supply monitoring circuit further comprises a disable circuit for disabling the supply monitoring circuit responsive to a disable control signal from the processing unit.

12. The single chip microcontroller unit of claim 10, wherein the enable circuit further comprises:
a voltage supply detector for determining when the supply voltage exceeds a voltage supply threshold and generating a first indication responsive thereto;
a band gap voltage detector for determining when the band gap voltage exceeds a band gap voltage threshold and generating a second indication responsive thereto; and
control logic for generating an enable signal responsive to the first indication and the second indication.

13. The single chip microcontroller of claim 10, further wherein the reference threshold voltage is adjustable responsive to a plurality of bits provided by the control processor.

14. The single chip microcontroller of claim 10, wherein the supply monitoring circuit further comprises:
a second supply monitoring circuit for generating an indication when the supply voltage exceeds a higher threshold level; and
wherein the enable circuit further disables the second supply monitoring circuit until the band gap voltage stabilizes at start up.

15. The single chip microcontroller unit of claim 14, wherein the second supply monitoring circuit further comprises a disable circuit for disabling the supply monitoring circuit responsive to a disable control signal from the processing unit.

16. A single chip microcontroller unit, comprising:
a processing unit having a normal power mode of operation and a low power mode of operation;
analog circuitry connected to the processing unit;
digital circuitry connected to the processing unit;
a power management unit controlling power operation of the processing unit, the analog circuitry and the digital circuitry; and
a supply monitoring circuit for determining if a chip supply voltage level exceeds a threshold level and generating a power control signal to the power management unit responsive thereto, wherein the supply monitoring circuit further comprises:
a first comparator circuit for comparing a band gap voltage to a reference threshold voltage; and an enable circuit for disabling the first comparator circuit until the band gap voltage stabilizes at start up;

a disable circuit for disabling the supply monitoring circuit responsive to a disable control signal from the processing unit, and further wherein the reference threshold voltage is adjustable responsive to a plurality of bits provided by the processing unit.

17. The single chip microcontroller unit of claim 16, wherein the enable circuit further comprises:

a voltage supply detector for determining when the supply voltage exceeds a voltage supply threshold and generating a first indication responsive thereto;

a band gap voltage detector for determining when the band gap voltage exceeds a band gap voltage threshold and generating a second indication responsive thereto; and control logic for generating an enable signal responsive to the first indication and the second indication.

18. The single chip microcontroller of claim 16, wherein the supply monitoring circuit further comprises:

a second supply monitoring circuit for generating an indication when the supply voltage exceeds a higher threshold level; and wherein the enable circuit further disables the second supply monitoring circuit until the band gap voltage stabilizes at start up.

19. The single chip microcontroller of claim 18, wherein the second supply monitoring circuit further comprises a disable circuit for disabling the supply monitoring circuit responsive to a disable control signal from the processing unit.

20. A single chip microcontroller unit, comprising:

a processing unit a having normal power mode of operation and a low power mode of operation;

analog circuitry connected to the processing unit;

digital circuitry connected to the processing unit;

a power management unit controlling power operation of the processing unit, the analog circuitry and the digital circuitry; and a supply monitoring circuit for determining if a chip supply voltage level exceeds a threshold level and generating a power control signal to the power management unit responsive thereto, wherein the supply monitoring circuit further comprises:

a first comparator circuit for comparing a band gap voltage to a reference threshold voltage;

an enable circuit for disabling the first comparator circuit until the band gap voltage stabilizes at start up;

a disable circuit for disabling the supply monitoring circuit responsive to a disable control signal from the processing unit;

a second supply monitoring circuit for generating an indication when the supply voltage exceeds a higher threshold level; and wherein the enable circuit further disables the second supply monitoring circuit until the band gap voltage stabilizes at start up.

21. The single chip microcontroller unit of claim 20, wherein the enable circuit further comprises:

a voltage supply detector for determining when the supply voltage exceeds a voltage supply threshold and generating a first indication responsive thereto;

a band gap voltage detector for determining when the band gap voltage exceeds a band gap voltage threshold and generating a second indication responsive thereto; and control logic for generating an enable signal responsive to the first indication and the second indication.

22. The single chip microcontroller of claim 20, wherein the reference threshold voltage is adjustable responsive to a plurality of bits provided by the processing unit.

23. The single chip microcontroller of claim 20, wherein the supply monitoring circuit further comprises:

a second supply monitoring circuit for generating an indication when the supply voltage exceeds a higher threshold level; and wherein the enable circuit further disables the second supply monitoring circuit until the band gap voltage stabilizes at start up.

24. The single chip microcontroller unit of claim 23, wherein the second supply monitoring circuit further comprises a disable circuit for disabling the supply monitoring circuit responsive to a disable control signal from the processing unit.

* * * * *